United States Patent
Song et al.

(10) Patent No.: US 12,406,743 B2
(45) Date of Patent: Sep. 2, 2025

(54) NON-VOLATILE MEMORY WITH SMART CONTROL OF OVERDRIVE VOLTAGE

(71) Applicant: SanDisk Technologies LLC, Addison, TX (US)

(72) Inventors: Yi Song, San Jose, CA (US); Jiahui Yuan, Fremont, CA (US); Xiaochen Zhu, Milpitas, CA (US); Lito De La Rama, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 168 days.

(21) Appl. No.: 18/357,274

(22) Filed: Jul. 24, 2023

(65) Prior Publication Data

US 2024/0233847 A1   Jul. 11, 2024

Related U.S. Application Data

(60) Provisional application No. 63/479,504, filed on Jan. 11, 2023.

(51) Int. Cl.
*G11C 29/02* (2006.01)
*G11C 29/52* (2006.01)

(52) U.S. Cl.
CPC .......... *G11C 29/021* (2013.01); *G11C 29/022* (2013.01); *G11C 29/52* (2013.01)

(58) Field of Classification Search
CPC ..... G11C 29/021; G11C 29/022; G11C 29/52; G11C 29/028
See application file for complete search history.

(56) References Cited

U.S. PATENT DOCUMENTS

| | | | |
|---|---|---|---|
| 7,535,764 B2 | 5/2009 | Chin et al. | |
| 8,644,075 B2 | 2/2014 | Hemink et al. | |
| 9,286,994 B1* | 3/2016 | Chen | G11C 16/3427 |
| 9,299,450 B1 | 3/2016 | Pang et al. | |
| 9,455,301 B2 | 9/2016 | Ratnam et al. | |
| 9,852,803 B2 | 12/2017 | Diep et al. | |
| 9,887,002 B1 | 2/2018 | Zhang et al. | |
| 10,008,271 B1 | 6/2018 | Diep et al. | |
| 10,008,277 B2 | 6/2018 | Pang et al. | |
| 10,297,323 B2 | 5/2019 | Yu et al. | |
| 10,726,923 B2 | 7/2020 | Yang | |
| 2010/0214850 A1* | 8/2010 | Hosono | G11C 16/0483 365/185.33 |
| 2012/0307561 A1 | 12/2012 | Joo et al. | |
| 2013/0314995 A1 | 11/2013 | Dutta et al. | |
| 2023/0170032 A1* | 6/2023 | Iwai | G11C 11/5642 365/185.22 |

OTHER PUBLICATIONS

U.S. Appl. No. 17/955,018, filed Sep. 28, 2022, "Non-Volatile Memory With Programmable Resistance Non-Data Word Line".

* cited by examiner

*Primary Examiner* — Mohammed A Bashar
(74) *Attorney, Agent, or Firm* — PEARL COHEN ZEDEK LATZER BARATZ LLP

(57) ABSTRACT

A non-volatile memory system detects a memory operation failure. In response to the memory operation failure, the system determines whether adjusting an overdrive voltage applied to a word line avoids the memory operation failure. If adjusting the overdrive voltage applied to the word line avoids the memory operation failure, then future memory operations are performed by applying the adjusted overdrive voltage to the word line.

17 Claims, 23 Drawing Sheets

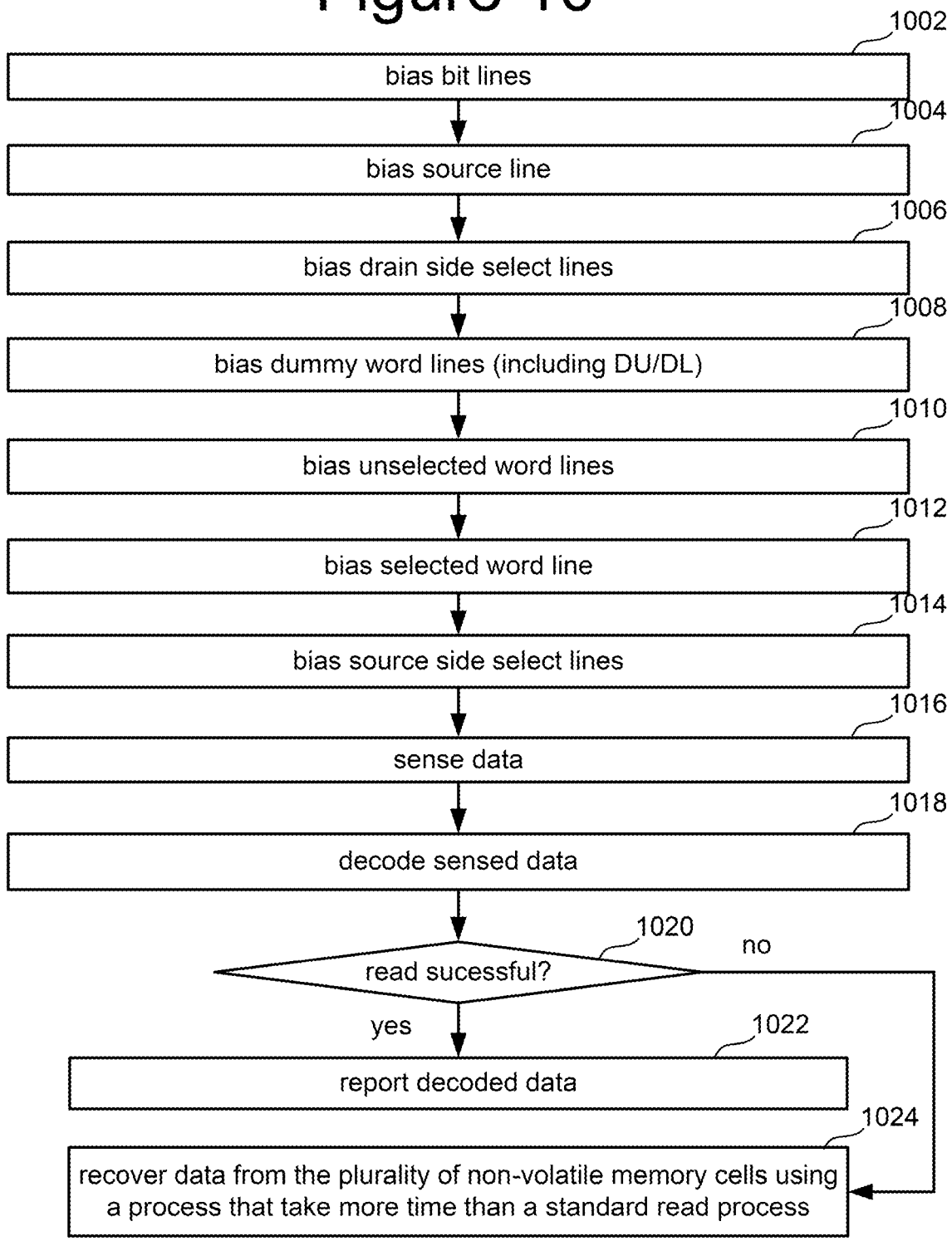

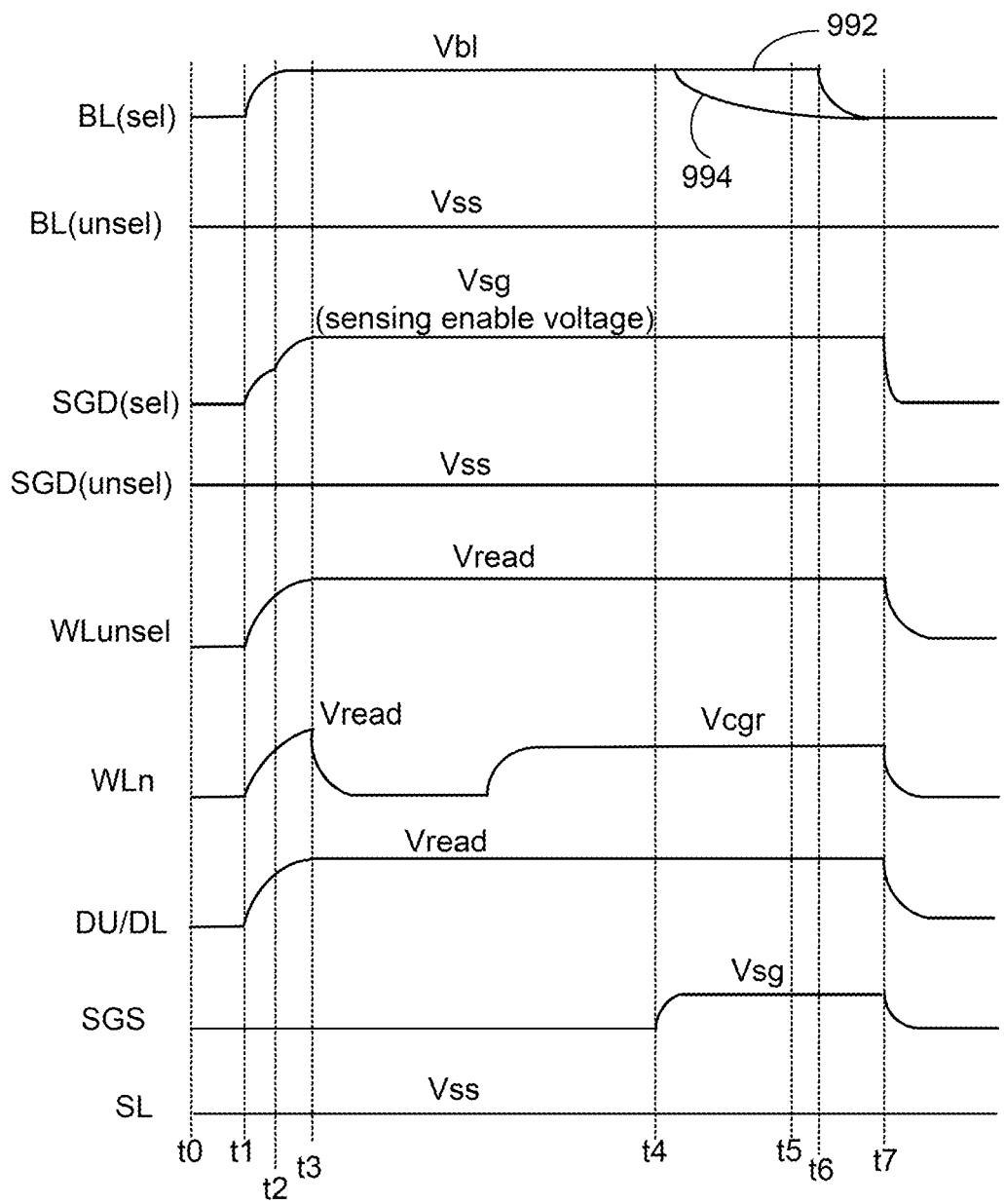

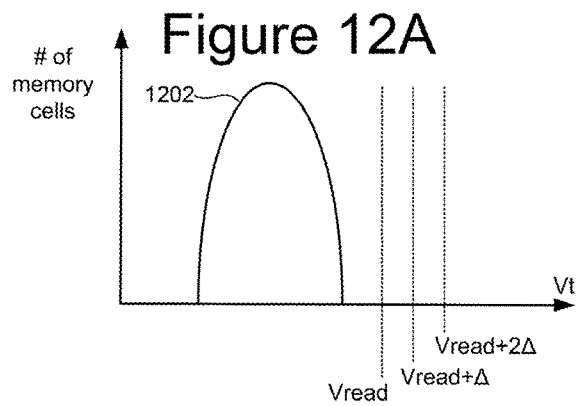
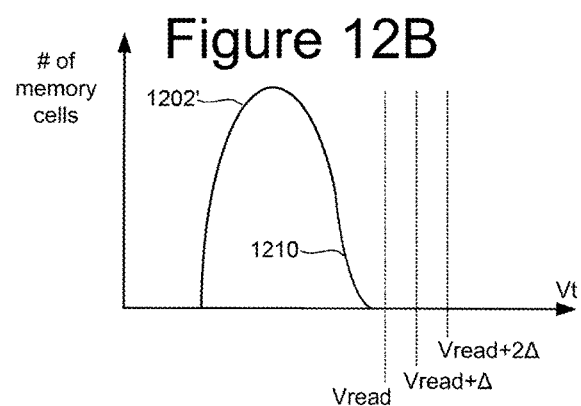
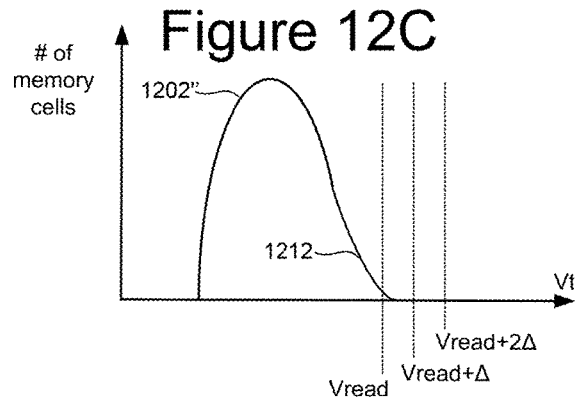
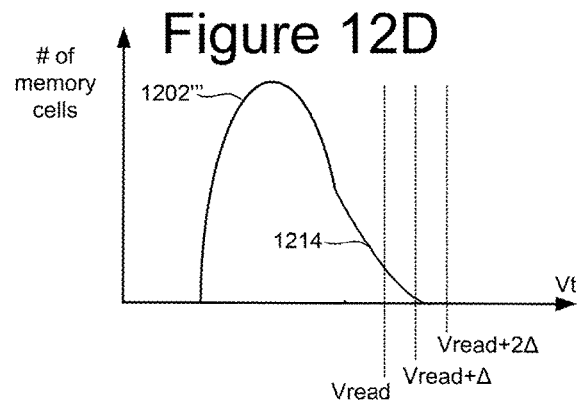

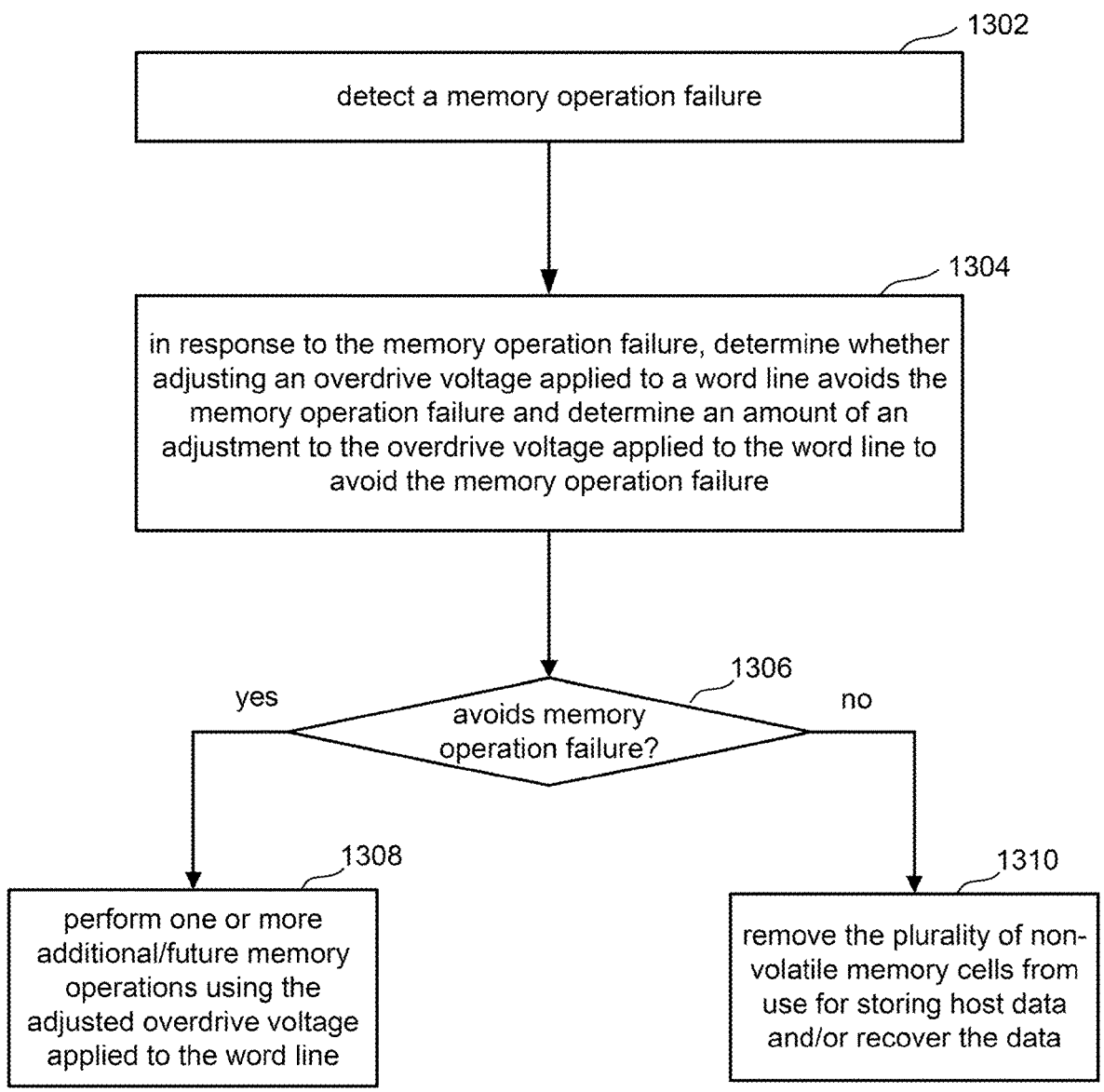

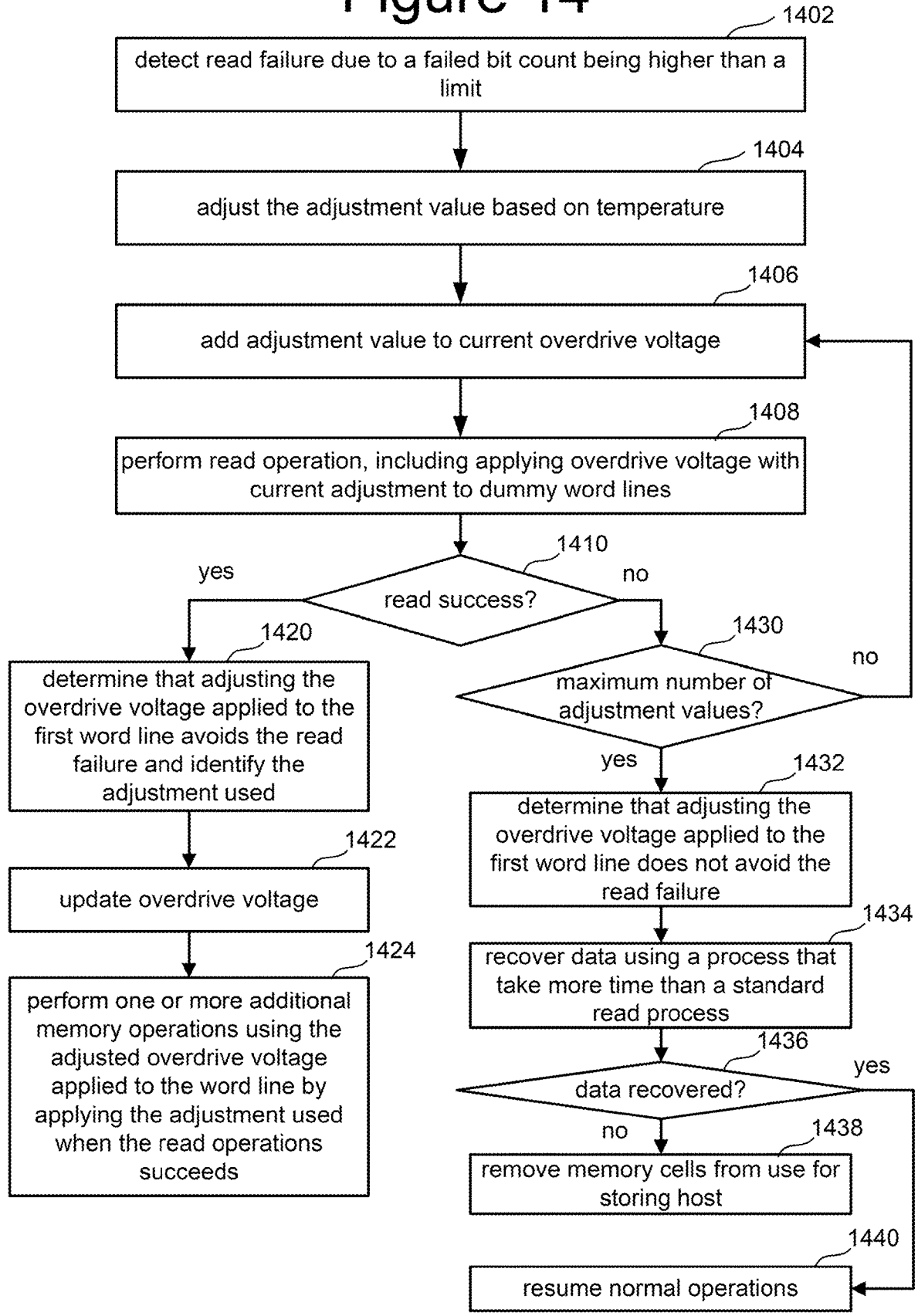

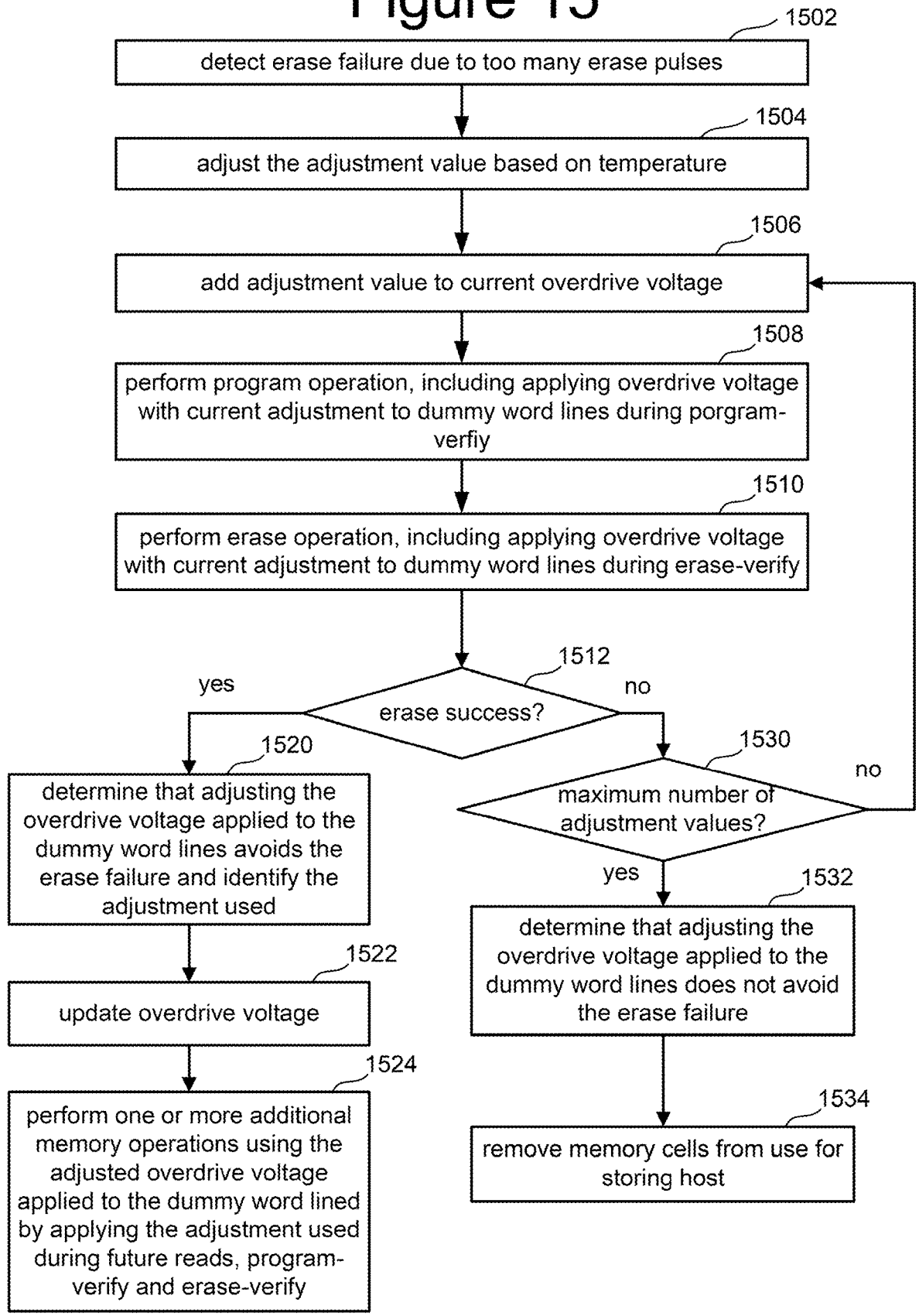

NON-VOLATILE MEMORY WITH SMART CONTROL OF OVERDRIVE VOLTAGE

CLAIM TO PRIORITY

The present application claims priority from U.S. Provisional Patent Application No. 63/479,504, entitled "NON-VOLATILE MEMORY WITH SMART CONTROL OF OVERDRIVE VOLTAGE", filed Jan. 11, 2023, incorporated by reference herein in its entirety.

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that it can be read back successfully.

BRIEF DESCRIPTION OF THE DRAWINGS

Like-numbered elements refer to common components in the different figures.

FIG. 10 is a flow chart of one embodiment of a read process.

FIG. 11 is a timing diagram depicting voltages applied to NAND strings during a program-verify process.

FIGS. 12A-D depict graphs of threshold voltage distributions.

FIG. 13 is a flow chart describing one embodiment of a process for performing intelligent control of the overdrive voltage applied to word lines (e.g., dummy word lines) in order to avoid memory operation failures.

FIG. 14 is a flow chart describing one embodiment of a process for performing intelligent control of the overdrive voltage applied to word lines (e.g., dummy word lines) in order to avoid memory operation failures.

FIG. 15 is a flow chart describing one embodiment of a process for performing intelligent control of the overdrive voltage applied to word lines (e.g., dummy word lines) in order to avoid memory operation failures.

DETAILED DESCRIPTION

A non-volatile memory system is proposed that includes intelligent control of the overdrive voltage applied to word lines (e.g., dummy word lines) in order to avoid the memory operation failures.

In one embodiment, a non-volatile memory system detects a memory operation failure. In response to detecting the memory operation failure, the system determines whether adjusting an overdrive voltage applied to a word line avoids the memory operation failure. If adjusting the overdrive voltage applied to the word line avoids the memory operation failure, then future memory operations are performed by applying the adjusted overdrive voltage to the word line.

Figure 1:
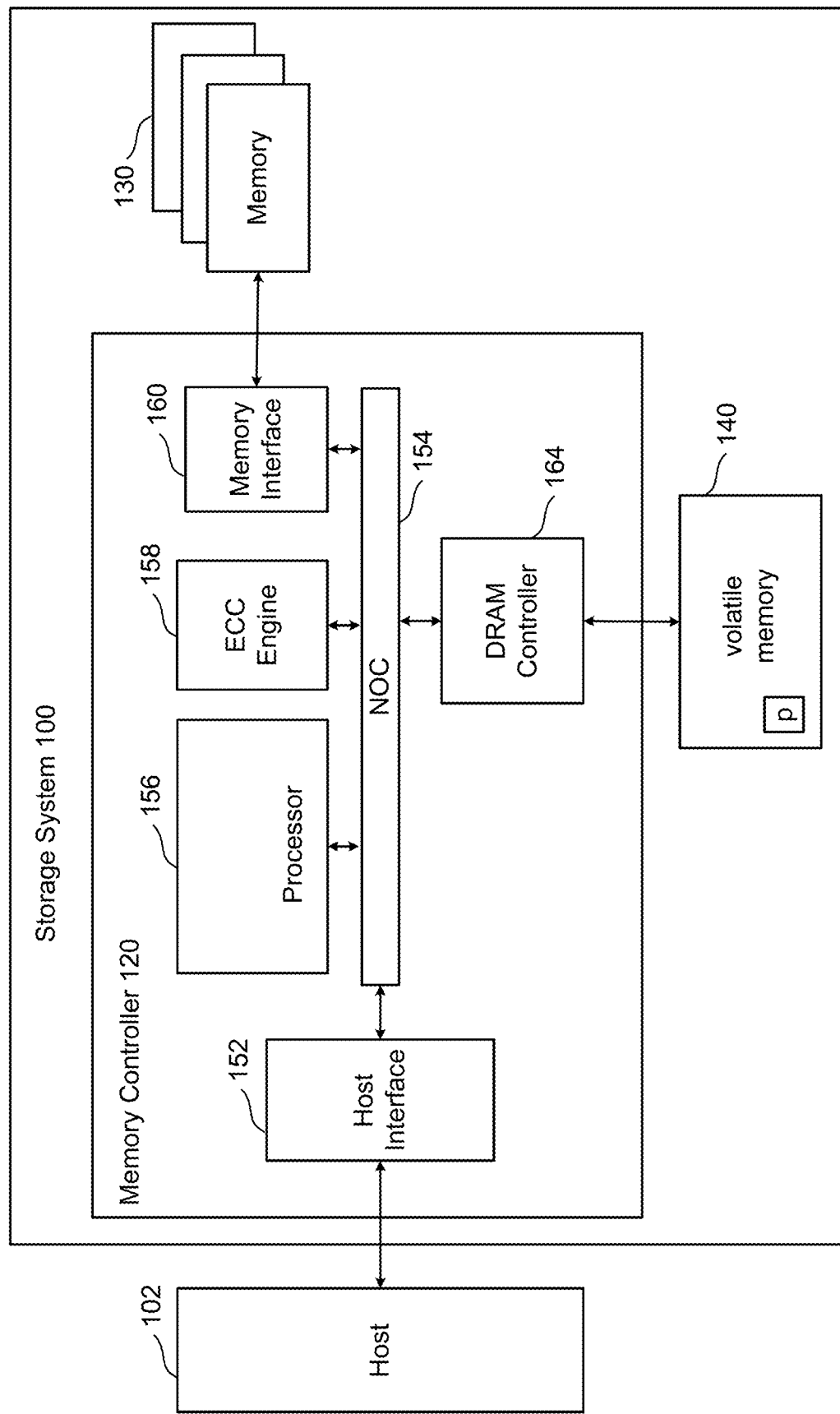
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

FIG. 1 shows volatile memory 140 storing parameters P. In one embodiment, parameters P includes the current voltage magnitude of an overdrive voltage used on certain word lines, as discussed below.

Figure 2A:
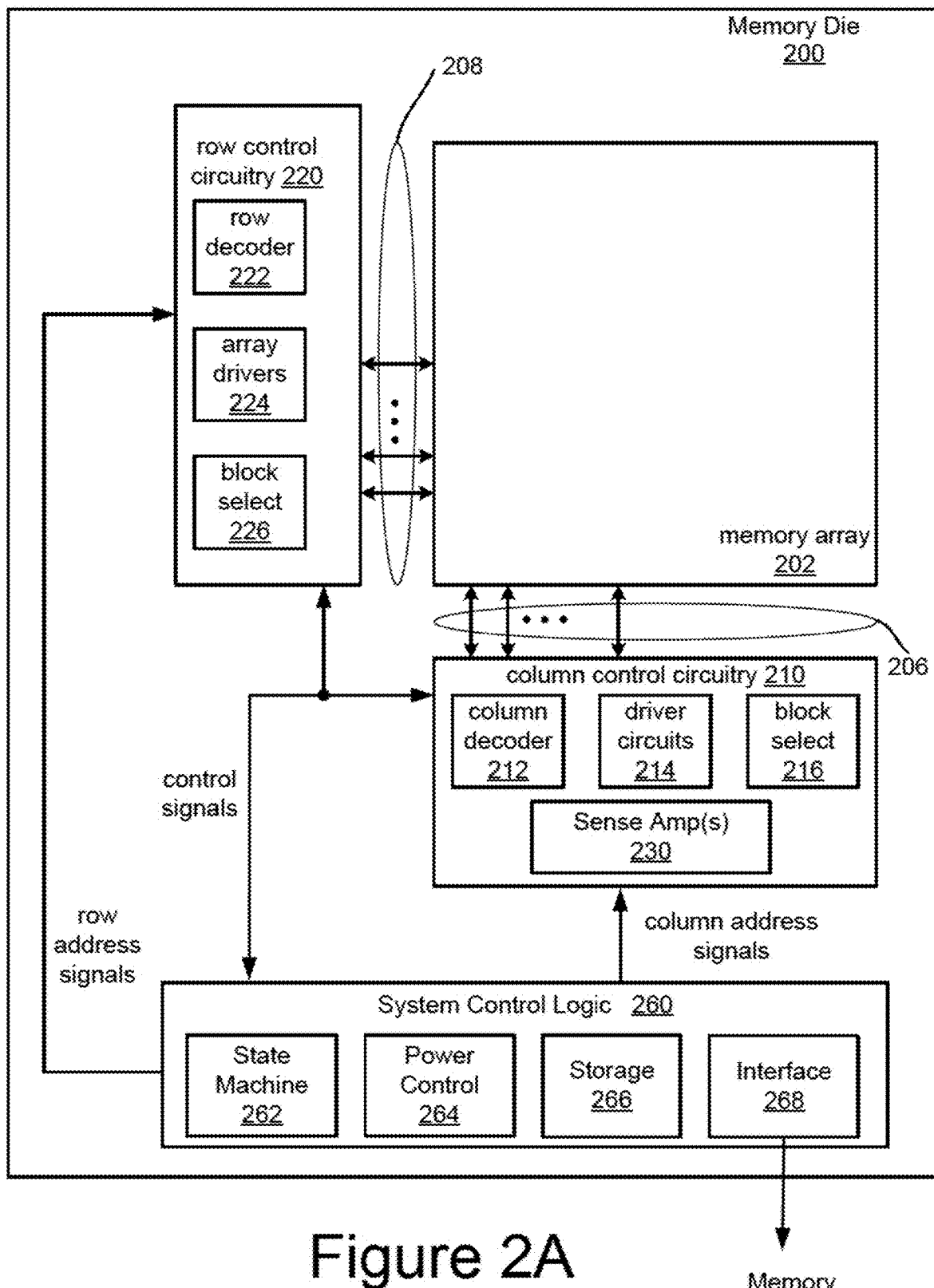
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprises non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 260, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations and may include charge pumps and regulator circuit for creating regulating voltages. System control logic 260 includes storage 366 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or another wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
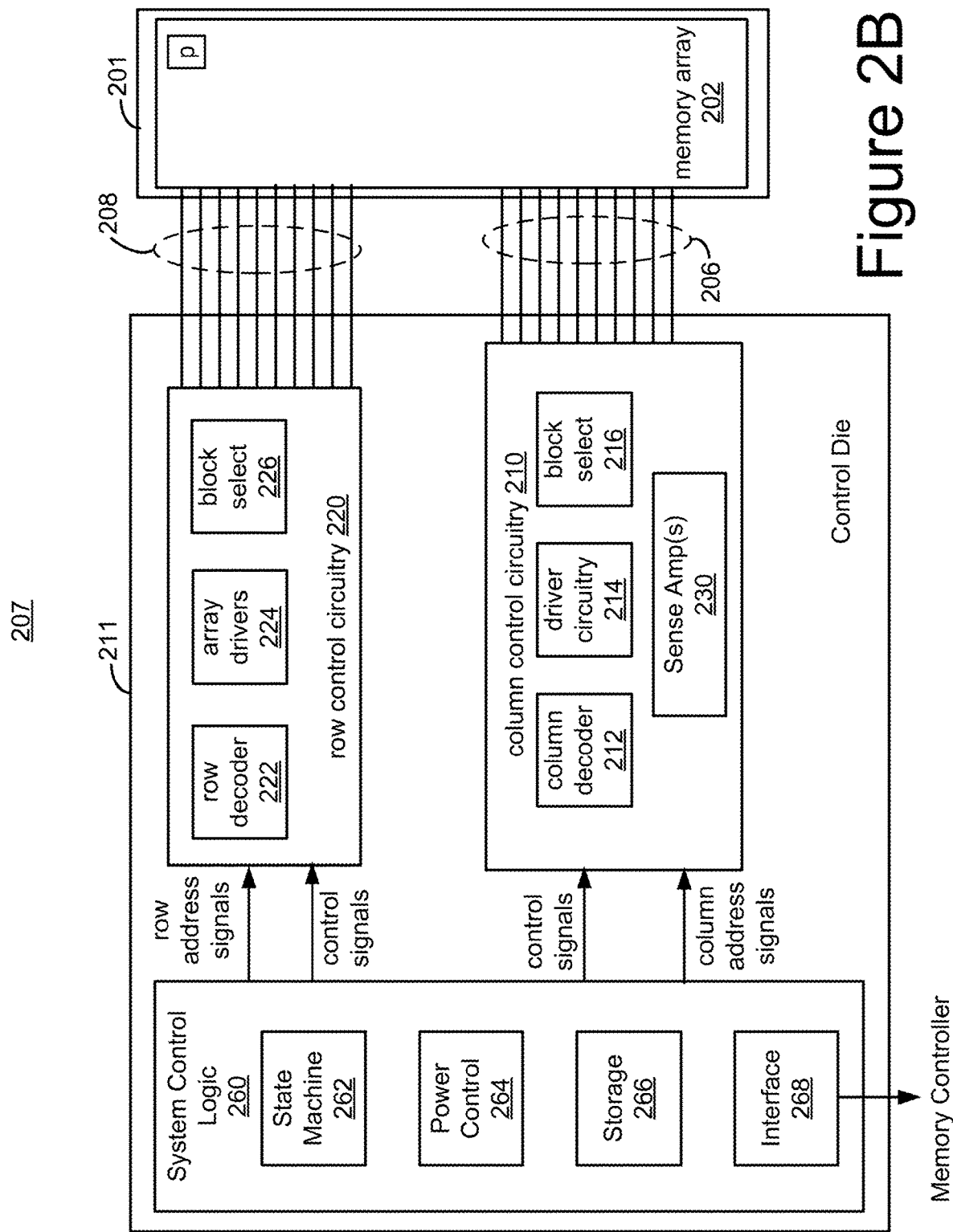
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201. FIGS. 2A and 2B show that parameters P can also (or instead) be stored in memory array 202.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

Figure 3A:
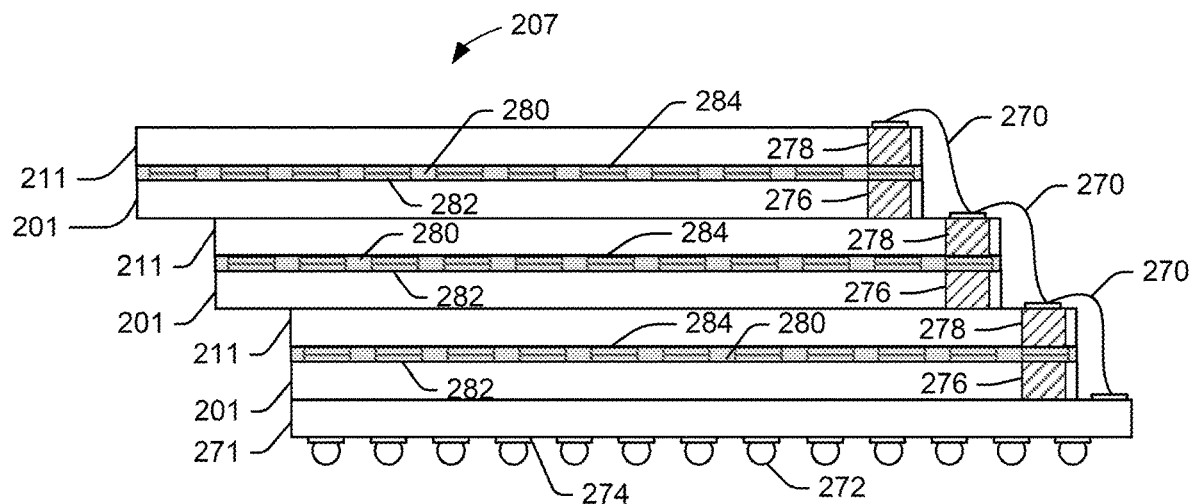
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
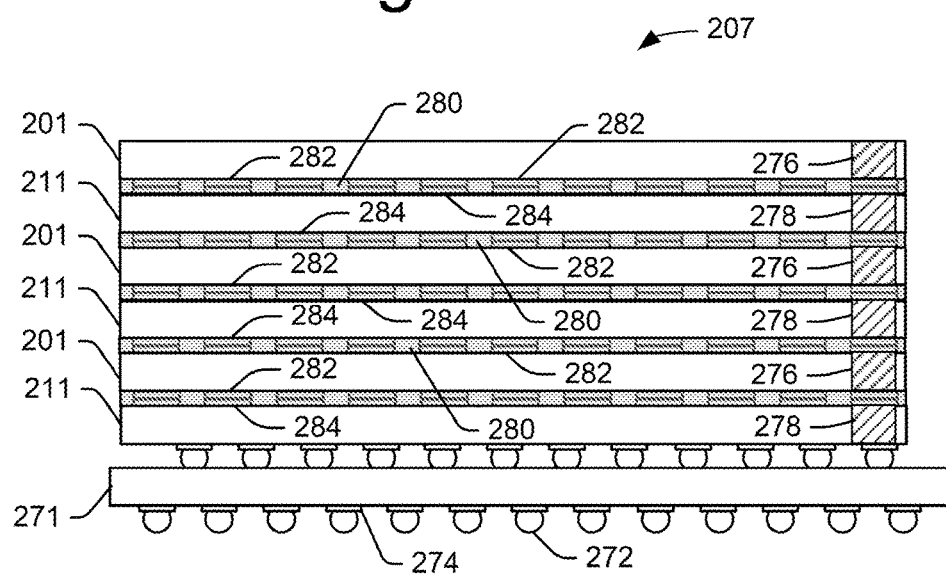

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller (or greater) sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
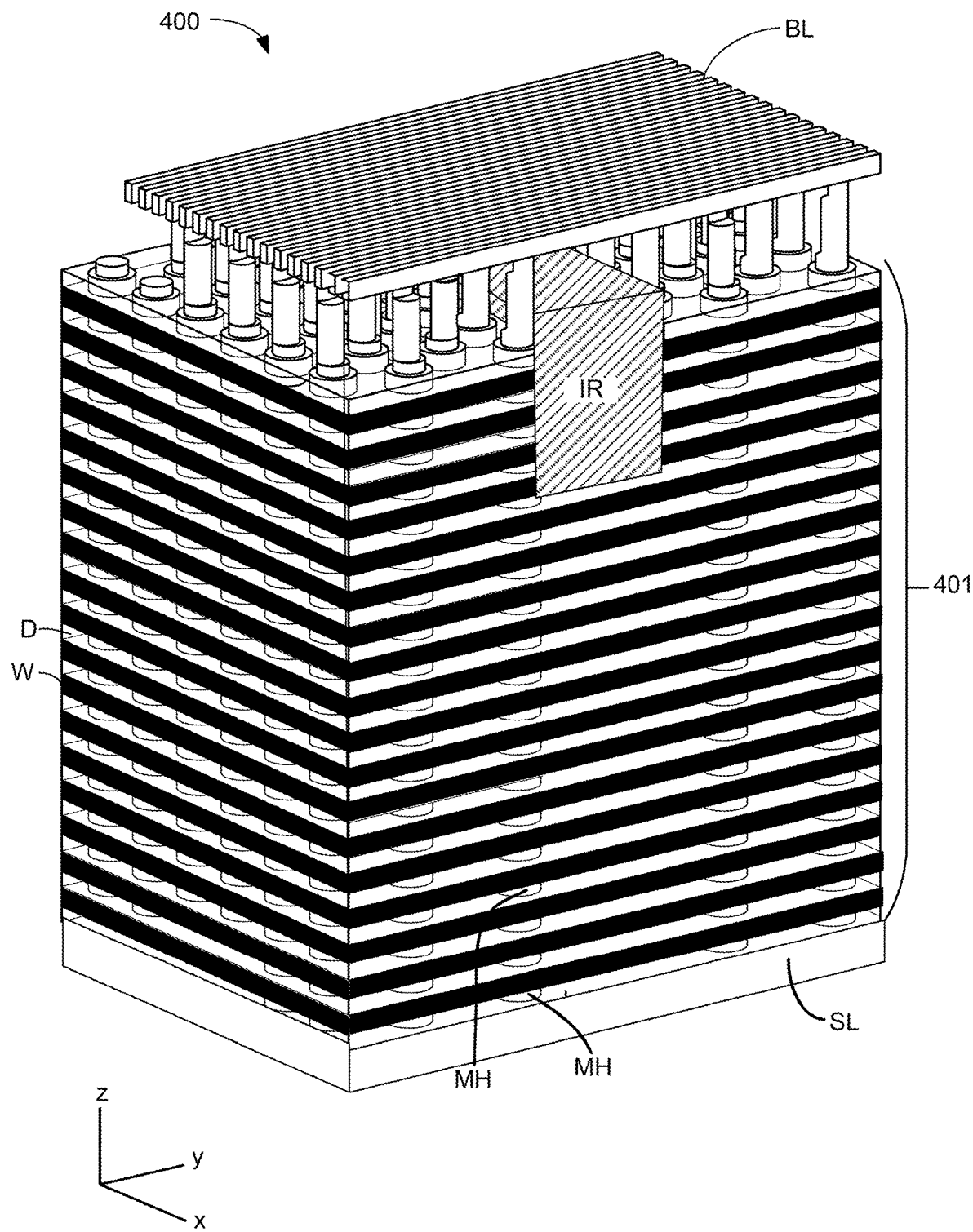
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into four or five (or a different number of) regions by isolation regions IR. FIG. 4 shows one isolation region IR separating two regions. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. Thus, the non-volatile memory cells are arranged in memory holes. More details of the three dimensional monolithic memory array that comprises memory structure 202 is provided below.

Figure 4A:
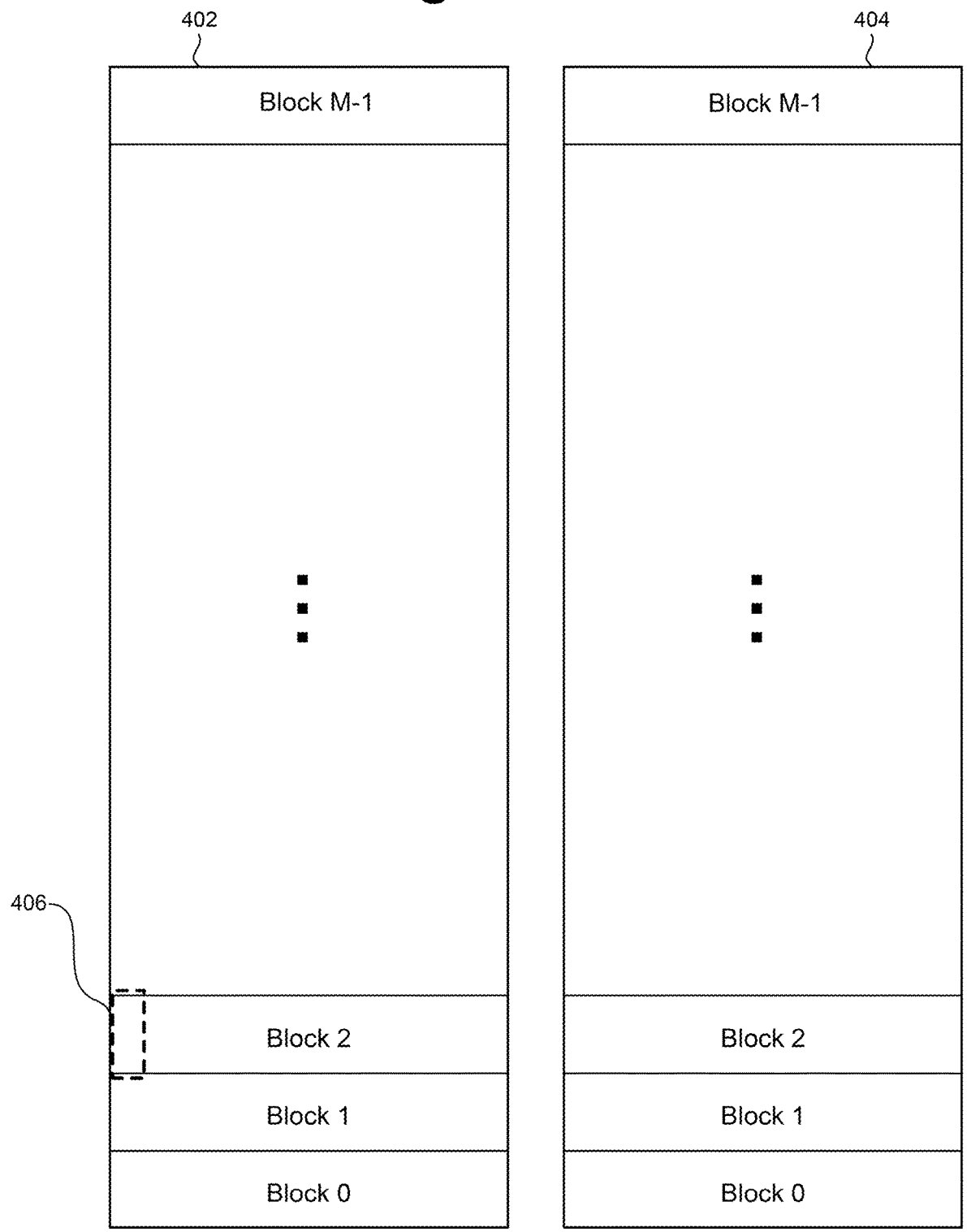
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 402/404, more or less than two planes can be implemented. In some embodiments, memory structure 202 includes eight planes.

Figure 4B:
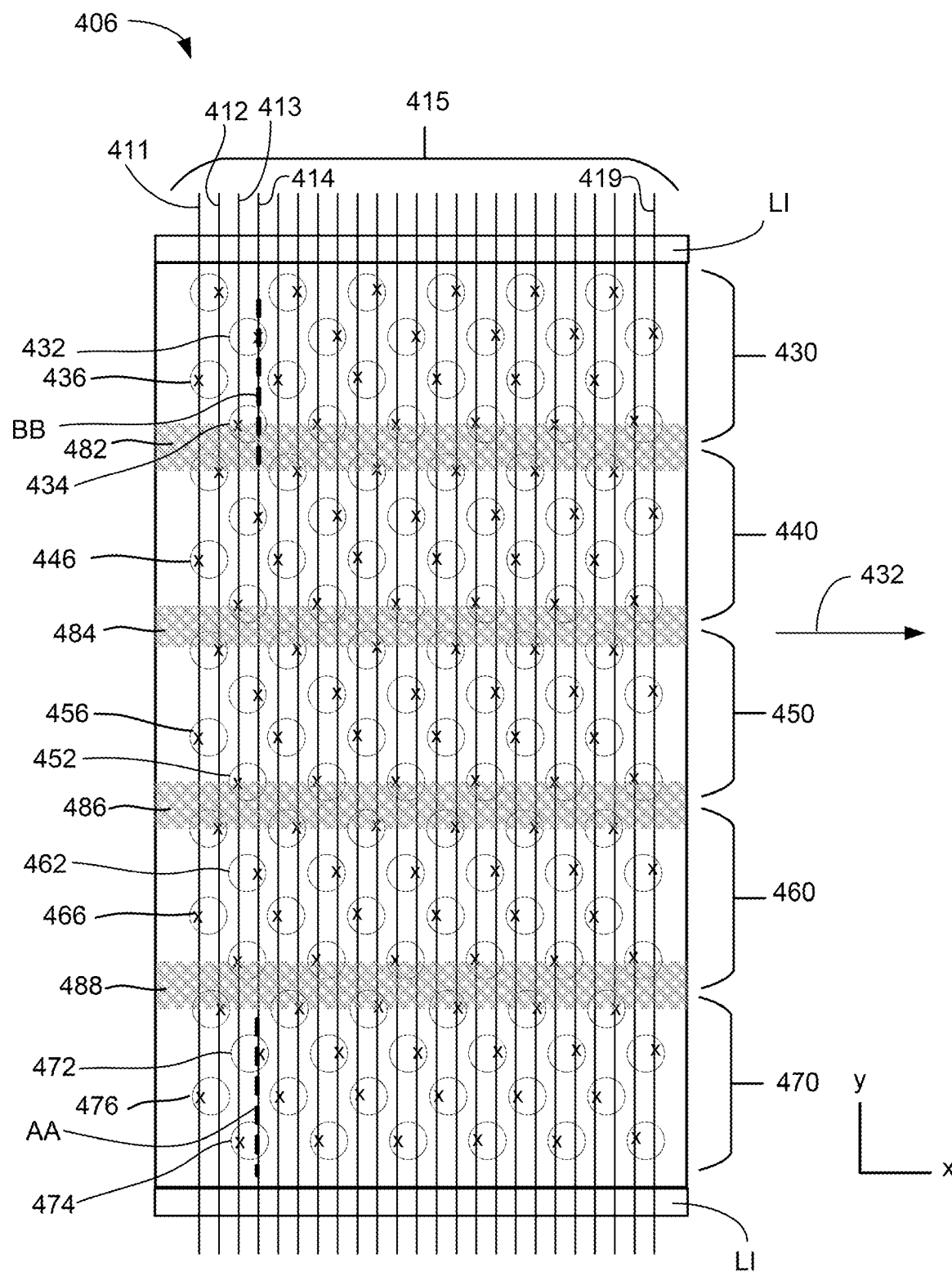
FIG. 4B depicts a top view of a portion of one embodiment of a block of memory cells.

FIGS. 4B-4G depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the memory holes, which are also referred to as vertical columns. Each of the memory holes/vertical columns include multiple select transistors (also referred to as a select gate or selection gate) and multiple memory cells. In one embodiment, each memory hole/vertical column implements a NAND string. For example, FIG. 4B labels a subset of the memory holes/vertical columns/NAND strings 432, 436, 446. 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to memory holes/vertical columns of the block. Each of the circles representing memory holes/vertical columns has an "x" to indicate its connection to one bit line. For example, bit line 411 is connected to memory holes/vertical columns 436, 446, 456, 466 and 476.

The block depicted in FIG. 4B includes a set of isolation regions 482, 484, 486 and 488, which are formed of $SiO_2$; however, other dielectric materials can also be used. Isolation regions 482, 484, 486 and 488 serve to divide the top layers of the block into five regions; for example, the top layer depicted in FIG. 4B is divided into regions 430, 440, 450, 460 and 470. In one embodiment, the isolation regions only divide the layers used to implement select gates so that NAND strings in different regions can be independently selected. In one example implementation, a bit line connects to one memory hole/vertical column/NAND string in each of regions 430, 440, 450, 460 and 470. In that implementation, each block has twenty four rows of active columns and each bit line connects to five rows in each block. In one embodiment, all of the five memory holes/vertical columns/ NAND strings connected to a common bit line are connected to the same set of word lines; therefore, the system uses the drain side selection lines to choose one (or another subset) of the five to be subjected to a memory operation (program, verify, read, and/or erase).

FIG. 4B also shows Line Interconnects LI, which are metal connections to the source line SL from above the memory array. Line Interconnects LI are positioned adjacent regions 430 and 470.

Although FIG. 4B shows each region 430, 440, 450, 460 and 470 having four rows of memory holes/vertical columns, five regions and twenty four rows of memory holes/ vertical columns in a block, those exact numbers are an example implementation. Other embodiments may include more or less regions per block, more or less rows of memory holes/vertical columns per region and more or less rows of vertical columns per block. FIG. 4B also shows the memory holes/vertical columns being staggered. In other embodiments, different patterns of staggering can be used. In some embodiments, the memory holes/vertical columns are not staggered.

Figure 4C:
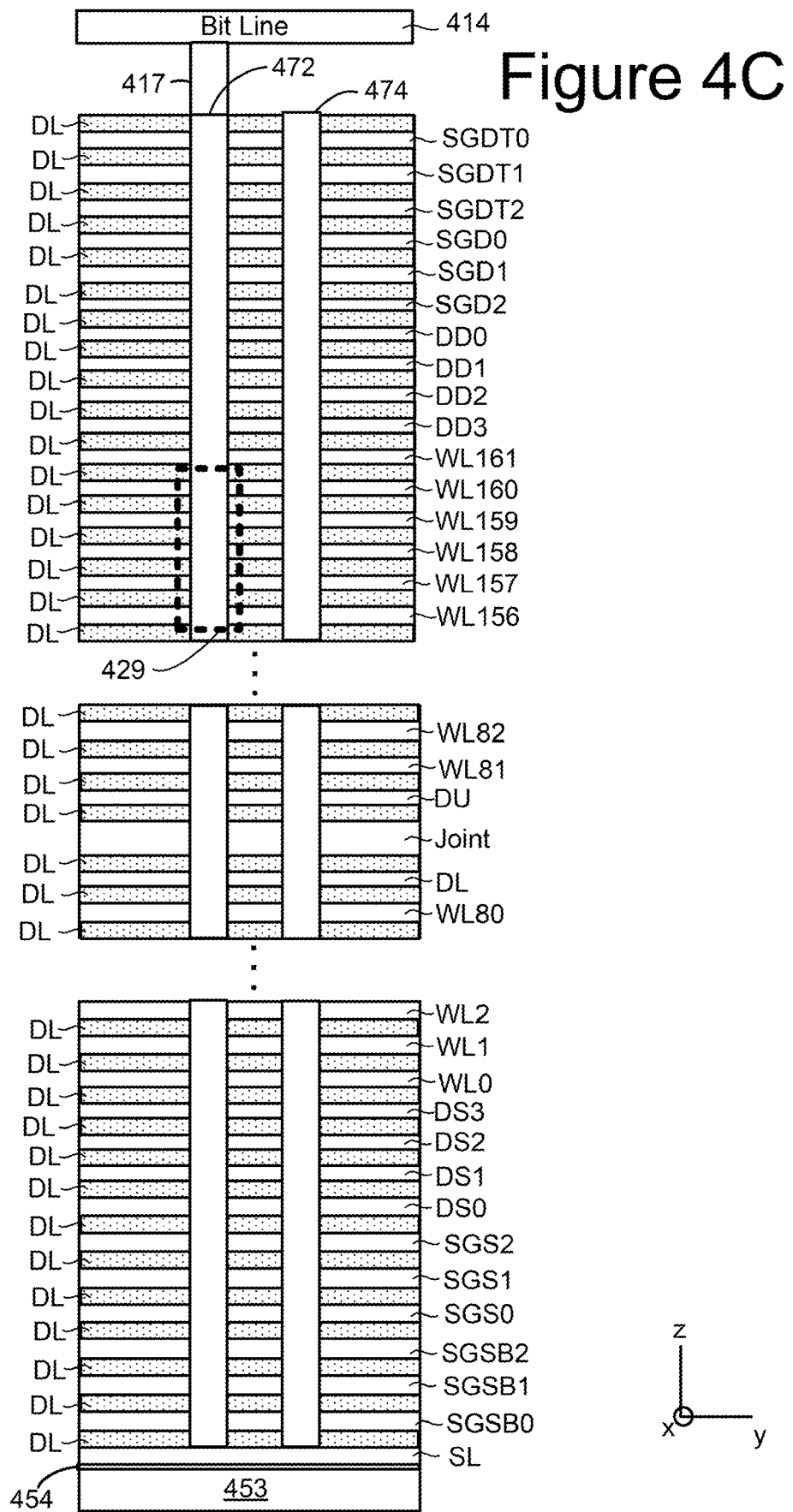
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through memory holes/vertical columns (NAND strings) 472 and 474 of region 470 (see FIG. 4B). The structure of FIG. 4C includes three drain side select layers SGD0, SGD1 and SGD2; three source side select layers SGS0, SGS1, and SGS2; three drain side GIDL generation transistor layers SGDT0, SGDT1, and SGDT2; three source side GIDL generation transistor layers SGSB0, SGSB1, and SGSB2; four drain side dummy word line layers DD0, DD1, DD2 and DD3; four source side dummy word line layers DS0, DS1, DS2 and DS3; dummy word line layers DU and DL; one hundred and sixty two word line layers WL0-WL161 for connecting to data memory cells, and dielectric layers DL. Other embodiments can implement more or less than the numbers described above for FIG. 4C. In one embodiment, SGD0, SGD1 and SGD2 are connected together; and SGS0, SGS1 and SGS2 are connected together. In other embodiments, more or less number of SGDs (greater or lesser than three) are connected together, and more or less number of SGSs (greater or lesser than three) connected together.

In one embodiment, erasing the memory cells is performed using gate induced drain leakage (GIDL), which includes generating charge carriers at the GIDL generation transistors such that the carriers get injected into the charge trapping layers of the NAND strings to change threshold voltage of the memory cells. FIG. 4C shows three GIDL generation transistors at each end of the NAND string; however, in other embodiments there are more or less than three. Embodiments that use GIDL at both sides of the NAND string may have GIDL generation transistors at both sides. Embodiments that use GIDL at only the drain side of the NAND string may have GIDL generation transistors only at the drain side. Embodiments that use GIDL at only the source side of the NAND string may have GIDL generation transistors only at the source side.

FIG. 4C shows three GIDL generation transistors at each end of the NAND string. It is likely that charge carriers are only generated by GIDL at one of the three GIDL generation transistors at each end of the NAND string. Based on process variances during manufacturing, it is likely that one of the three GIDL generation transistors at an end of the NAND string is best suited for GIDL. For example, the GIDL generation transistors have an abrupt pn junction to generate the charge carriers for GIDL and, during fabrication, a phosphorous diffusion is performed at the polysilicon channel of the GIDL generation transistors. In some cases, the GIDL generation transistor with the shallowest phosphorous diffusion is the GIDL generation transistor that generates the charge carriers during erase. However, in some embodiments charge carriers can be generated by GIDL at multiple GIDL generation transistors at a particular side of the NAND string.

Memory holes/Vertical columns 472 and 474 are depicted protruding through the drain side select layers, source side select layers, dummy word line layers, GIDL generation transistor layers and word line layers. In one embodiment, each memory hole/vertical column comprises a vertical NAND string. Below the memory holes/vertical columns and the layers listed below is substrate 453, an insulating film 454 on the substrate, and source line SL. The NAND string of memory hole/vertical column 472 has a source end at a bottom of the stack and a drain end at a top of the stack.

As in agreement with FIG. 4B, FIG. 4C show vertical memory hole/column 472 connected to bit line 414 via connector 417.

For ease of reference, drain side select layers; source side select layers, dummy word line layers, GIDL generation transistor layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten, metal silicide, such as nickel silicide, tungsten silicide, aluminum silicide or the combination thereof. In some embodiments, different conductive layers can be formed from different materials. Between conductive layers are dielectric layers DL. In one embodiment, the dielectric layers are made from SiO$_2$. In other embodiments, other dielectric materials can be used to form the dielectric layers.

The non-volatile memory cells are formed along memory holes/vertical columns which extend through alternating conductive and dielectric layers in the stack. In one embodiment, the memory cells are arranged in NAND strings. The word line layers WL0-W161 connect to memory cells (also called data memory cells). Dummy word line layers (dummy word lines) connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

FIG. 4C shows that the memory array is implemented as a two tier architecture, with the tiers separated by a Joint area. In one embodiment it is expensive and/or challenging to etch so many word line layers intermixed with dielectric layers. To ease this burden, one embodiment includes laying down a first stack of word line layers (e.g., WL0-WL80) alternating with dielectric layers, laying down the Joint area, and laying down a second stack of word line layers (e.g., WL81-WL161) alternating with dielectric layers. The Joint areas are positioned between the first stack and the second stack. In one embodiment, the Joint areas are made from the same materials as the word line layers. In other embodiments, there can be no Joint area or multiple Joint areas.

Figure 4D:
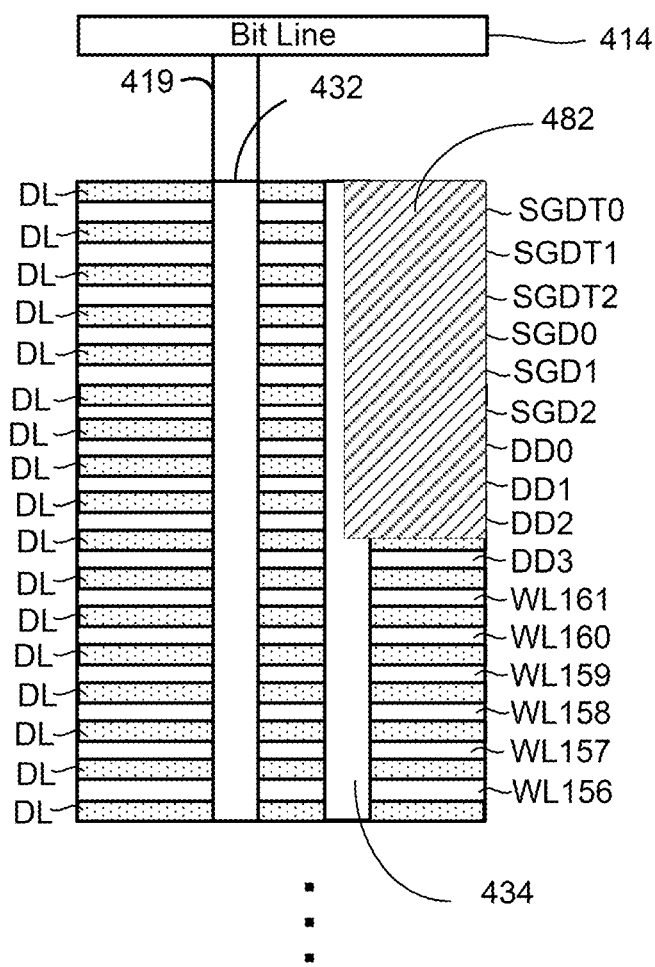
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through memory holes/vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 482, 484, 486 and 488) occupy space that would have been used for a portion of the memory holes/vertical columns/NAND stings. For example, isolation region 482 occupies space that would have been used for a portion of memory hole/vertical column 434. More specifically, a portion (e.g., half the diameter) of vertical column 434 has been removed in layers SGDT0, SGDT1, SGDT2, SGD0, SGD1, SGD2, DD0,DD1 and DD2 to accommodate isolation region 482. Thus, while most of the vertical column 434 is cylindrical (with a circular cross section), the portion of vertical column 434 in layers SGDT0, SGDT1, SGDT2, SGD0, SGD1, SGD2, DD0,DD1 and DD2 has a semi-circular cross section. In one embodiment, after the stack of alternating conductive and dielectric layers is formed, the stack is etched to create space for the isolation region and that space is then filled in with SiO$_2$.

Figure 4E:
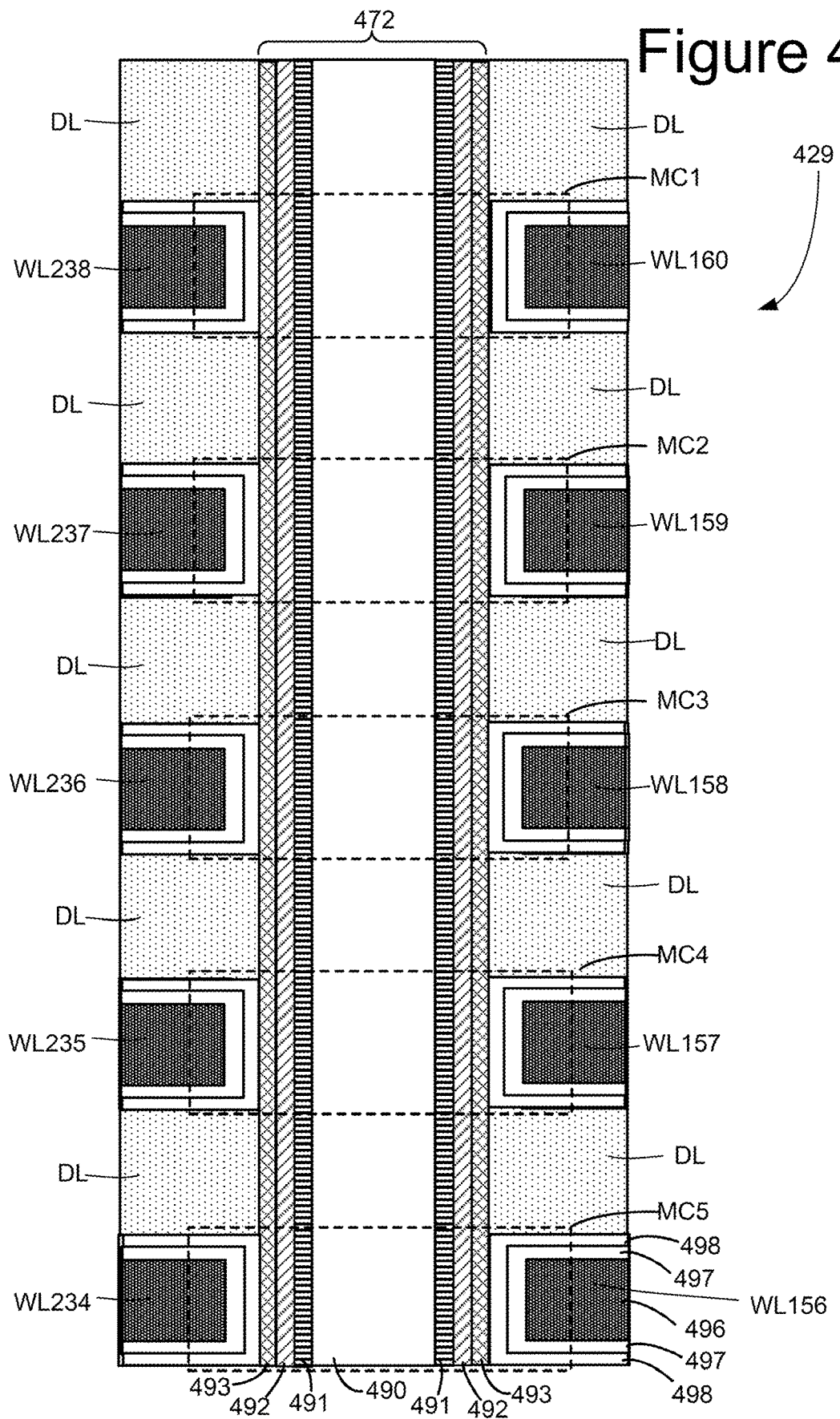
FIG. 4E is a cross sectional view of one embodiment of a vertical column of memory cells.

FIG. 4E depicts a cross sectional view of region 429 of FIG. 4C that includes a portion of memory hole/vertical column 472. In one embodiment, the memory holes/vertical columns are round; however, in other embodiments other shapes can be used. In one embodiment, memory hole/vertical column 472 includes an inner core layer 490 that is made of a dielectric, such as SiO$_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4E depicts dielectric layers DL as well as word line layers WL160, WL159, WL158, WL157, and WL156. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WL160 and a portion of memory hole/vertical column 472 comprise a memory cell MC1. Word line layer WL159 and a portion of memory hole/vertical column 472 comprise a memory cell MC2. Word line layer WL158 and a portion of memory hole/vertical column 472 comprise a memory cell MC3. Word line layer WL157 and a portion of memory hole/vertical column 472 comprise a memory cell MC4. Word line layer WL156 and a portion of memory hole/vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4F:
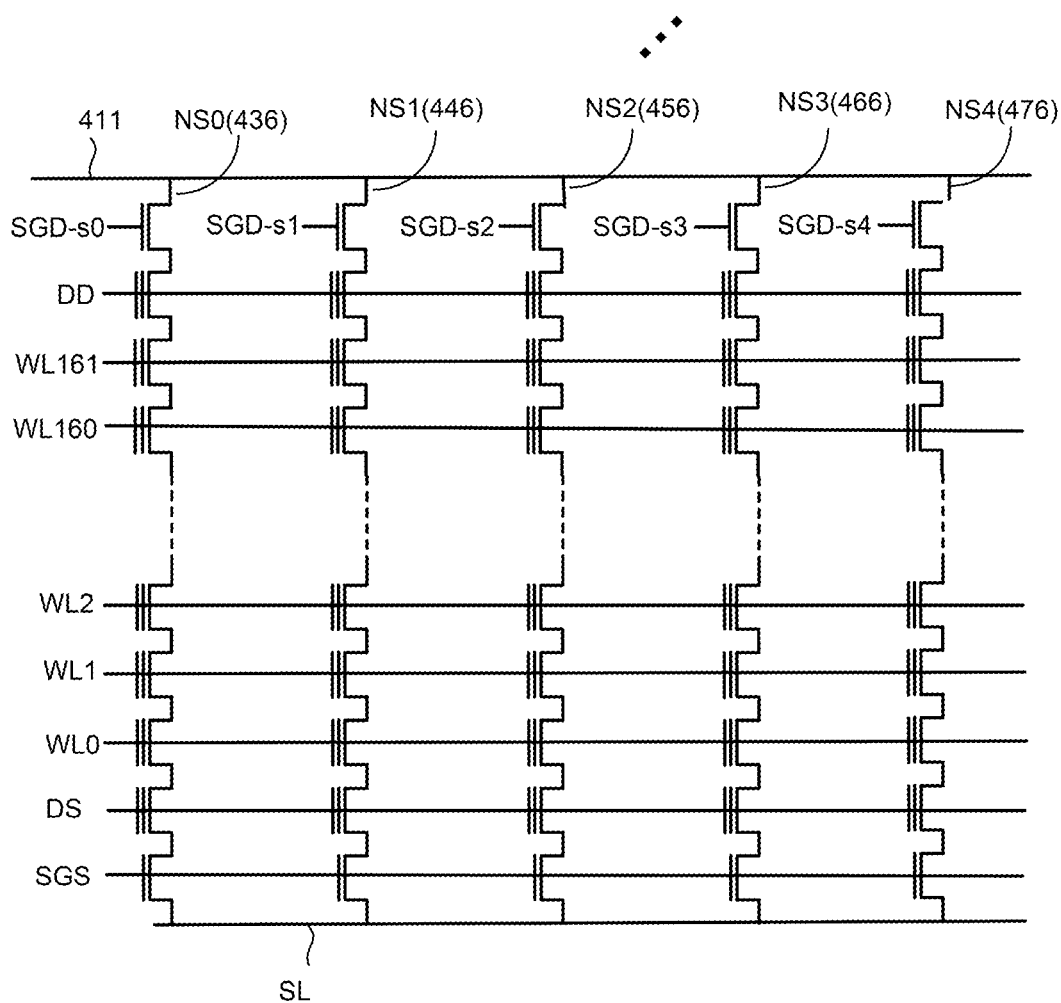
FIG. 4F is a schematic of a plurality of NAND strings in multiple regions of a same block.

FIG. 4F is a schematic diagram of a portion of the memory array 202 depicted in FIGS. 4-4E. FIG. 4F shows physical data word lines WL0-WL161 running across the entire block. The structure of FIG. 4F corresponds to a portion 406 in Block 2 of FIG. 4A, including bit line 411. Within the block, in one embodiment, each bit line is connected to five NAND strings. Thus, FIG. 4F shows bit line connected to NAND string NS0 (which corresponds to memory hole/vertical column 436), NAND string NS1 (which corresponds to memory hole/vertical column 446), NAND string NS2 (which corresponds to vertical column 456), NAND string NS3 (which corresponds to memory hole/vertical column 466), and NAND string NS4 (which corresponds to memory hole/vertical column 476). As mentioned above, in one embodiment, SGD0, SGD1 and SGD2 are connected together to operate as a single logical select gate for each region separated by isolation regions (482, 484, 486 and 488) to form SGD-s0, SGD-s1, SGD-s2, SGD-s3, and SGD-s4. SGS0, SGS1 and SGS2 are also connected together to operate as a single logical select gate that is represented in FIG. 4F as SGS. Although the select gates SGD-s0, SGD-s1, SGD-s2, SGD-s3, and SGD-s4 are isolated from each other due to the isolation regions, the data word lines WL0-WL161 of each region are connected together. Thus, data word lines WL0-WL161 are connected to NAND strings (and memory cells) of each (or every) region (430, 440, 450, 460, 470) of a block.

The isolation regions (482, 484, 486 and 488) are used to allow for separate control of regions 430, 440, 450, 460, 470. A first region corresponds to those vertical NAND strings controlled by SGD-s0. A second region corresponds to those vertical NAND strings controlled by SGD-s1. A third region corresponds to those vertical NAND strings controlled by SGD-s2. A fourth region corresponds to those vertical NAND strings controlled by SGD-s3. A fifth region corresponds to those vertical NAND strings controlled by SGD-s4.

FIG. 4F only shows NAND strings connected to bit line 411. However, a full schematic of the block would show every bit line and five vertical NAND strings (that are in separate regions) connected to each bit line.

Although the example memories of FIGS. 4-4F are three dimensional memory structure that includes vertical NAND strings with charge-trapping material, other (2D and 3D) memory structures can also be used with the technology described herein.

Figure 5A:
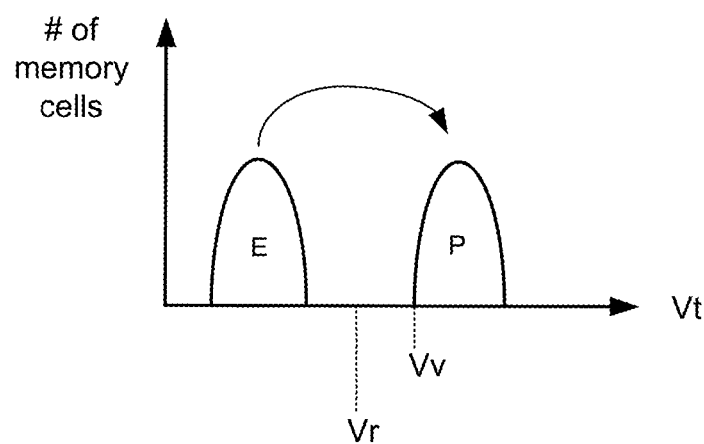
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Figure 5B:
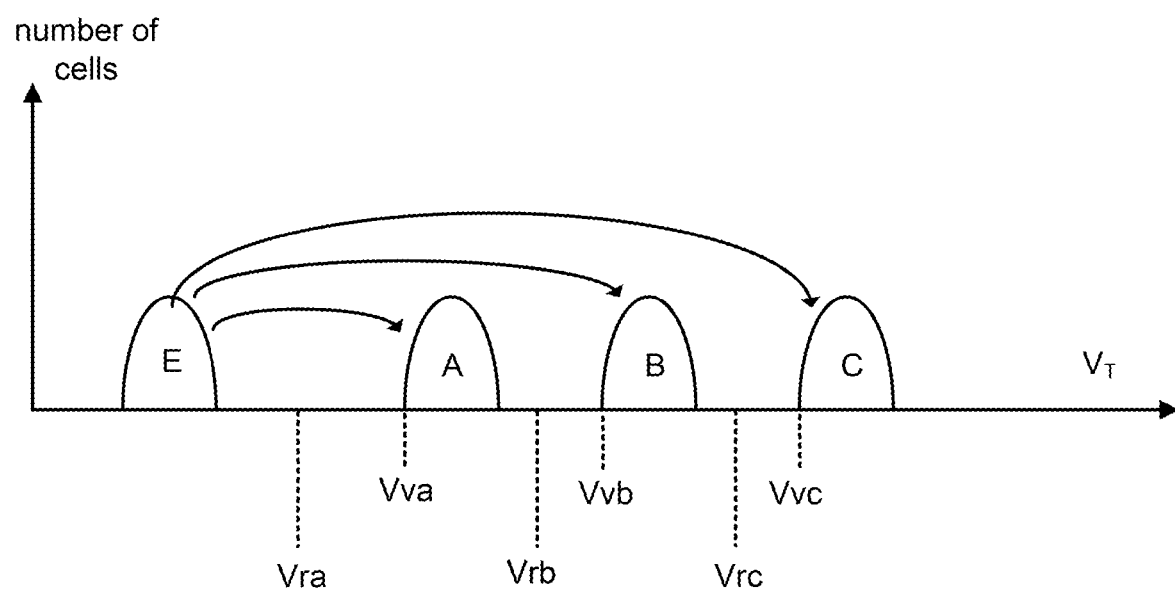
FIG. 5B depicts threshold voltage distributions.
Figure 5C:
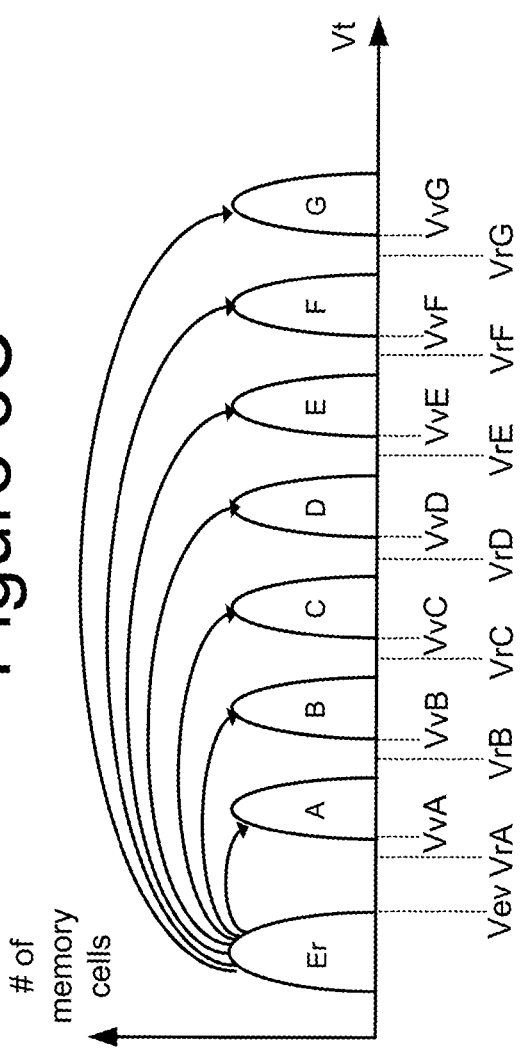
FIG. 5C depicts threshold voltage distributions.
Figure 5D:
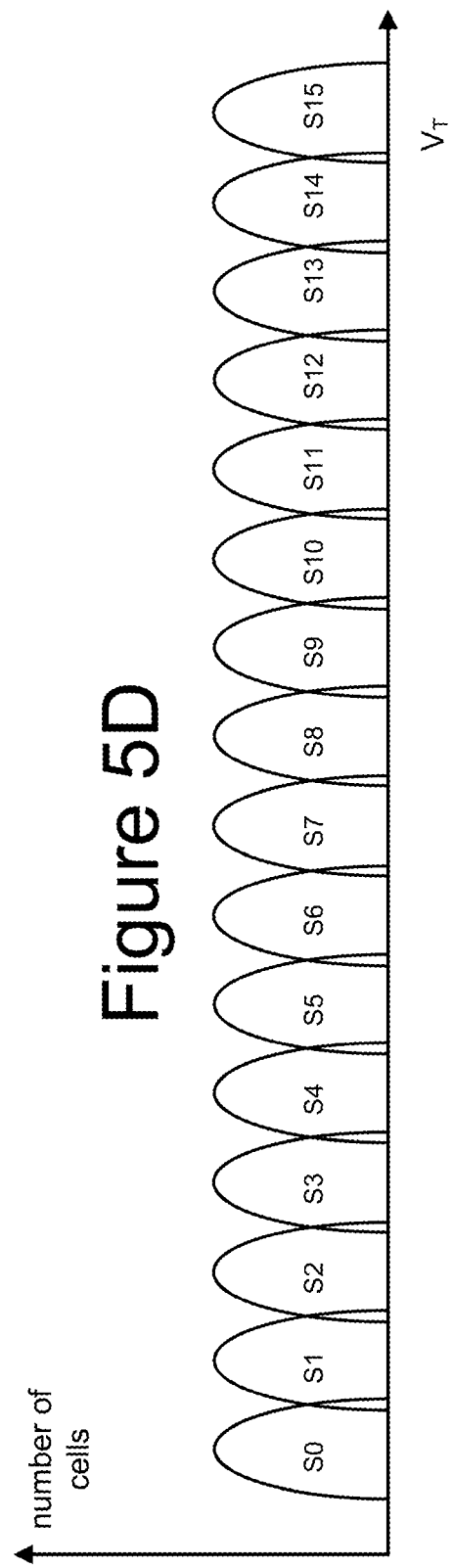
FIG. 5D depicts threshold voltage distributions.

FIGS. 5B-D illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, or five bits of data per memory cell).

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|---|---|---|---|---|---|---|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 5C also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is an erase verify reference voltage to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state Er to data state A, other memory cells are being programmed from data state Er to data state B and/or from data state Er to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages/levels VrA, VrB, VrC, VrD, VrE, VrF, and VrG, of FIG. 5C) or verify operation (e.g. see verify target voltages/levels VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities. Note that in some embodiments, the threshold voltage distributions for a population of memory cells storing four bits of data per memory cell do not overlap and are separated from each other. The threshold voltage distributions of FIG. 5D will include read reference voltages and verify reference voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 0  | 1  | 1  | 1   | 1   | 1   | 1   | 0   | 0   |
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   |

Figure 6:
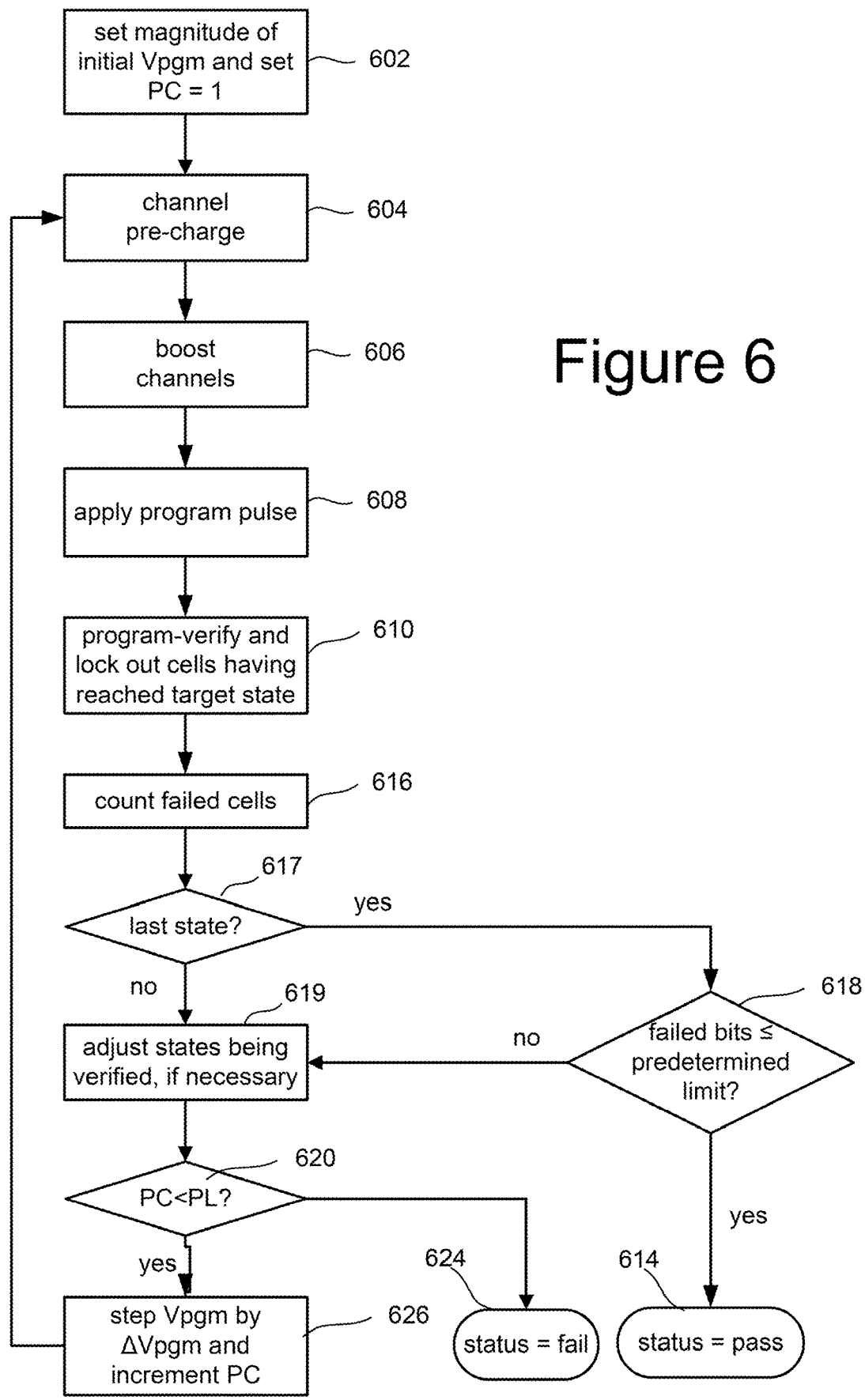
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. As part of step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming. Note that during steps 604, 606 and 608, voltages are applied to the dummy word lines (including the dummy word lines DU and DL that are next to the Joint area).

In step 610, program-verify is performed, which includes testing whether memory cells being programmed have successfully reached their target data state. Memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state.

In one embodiment of step 610, a smart verify technique is used such that the system only verifies a subset of data states during a program loop (steps 604-626). For example, the first program loop includes verifying for data state A (see FIG. 5C), depending on the result of the verify operation the second program loop may perform verify for data states A and B, depending on the result of the verify operation the third program loop may perform verify for data states B and C, and so on.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 617, the system determines whether the verify operation in the latest performance of step 610 included verifying for the last data state (e.g., data state G of FIG. 5C). If so, then in step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, then the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If in step 617 it was determined that the verify operation in the latest performance of step 610 did not include verifying for the last data state or in step 618 it was determined that the number of failed memory cells is not less than the predetermined limit, then in step 619 the data states that will be verified in the next performance of step 610 (in the next program loop) is adjusted as per the smart verify scheme discussed above. In step 620, the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process continues at step 604 and another program pulse is applied to the selected word line (by the control die) so that another program loop (steps 604-626) of the programming process of FIG. 6 is performed.

In one embodiment memory cells are erased prior to programming. Erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the memory cells. Herein, this is referred to as p-well erase.

Another approach to erasing memory cells is to generate gate induced drain leakage ("GIDL") current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a GIDL generation transistor (e.g., transistors connected to SGDT0, SGDT1, SGDT2, SGSB0, SGSB1 and SGSB2). In some embodiments, a select gate (e.g., SGD or SGS) can be used as a GIDL generation transistor. A transistor drain-to-gate voltage that generates a GIDL current is referred to herein as a GIDL voltage. The GIDL current may result when the GIDL generation transistor drain voltage is significantly higher than the GIDL generation transistor control gate voltage. GIDL current is a result of carrier generation, i.e., electron-hole pair generation due to band-to-band tunneling and/or trap-assisted generation. In one embodiment, GIDL current may result in one type of carriers (also referred to a charge carriers), e.g., holes, predominantly moving into the NAND channel, thereby raising or changing the potential of the channel. The other type of carriers, e.g., electrons, are extracted from the channel, in the direction of a bit line or in the direction of a source line, by an electric field. During erase, the holes may tunnel from the channel to a charge storage region of the memory cells (e.g., to charge trapping layer 493) and recombine with electrons there, to lower the threshold voltage of the memory cells.

The GIDL current may be generated at either end (or both ends) of the NAND string. A first GIDL voltage may be created between two terminals of a GIDL generation transistor (e.g., connected to SGDT0, SGDT1, SGDT2) that is connected to or near a bit line to generate a first GIDL current. A second GIDL voltage may be created between two terminals of a GIDL generation transistor (e.g., SGSB0, SGSB1 and SGSB2) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase. The technology described herein can be used with one-sided GIDL erase and two-sided GIDL erase.

Figure 7:
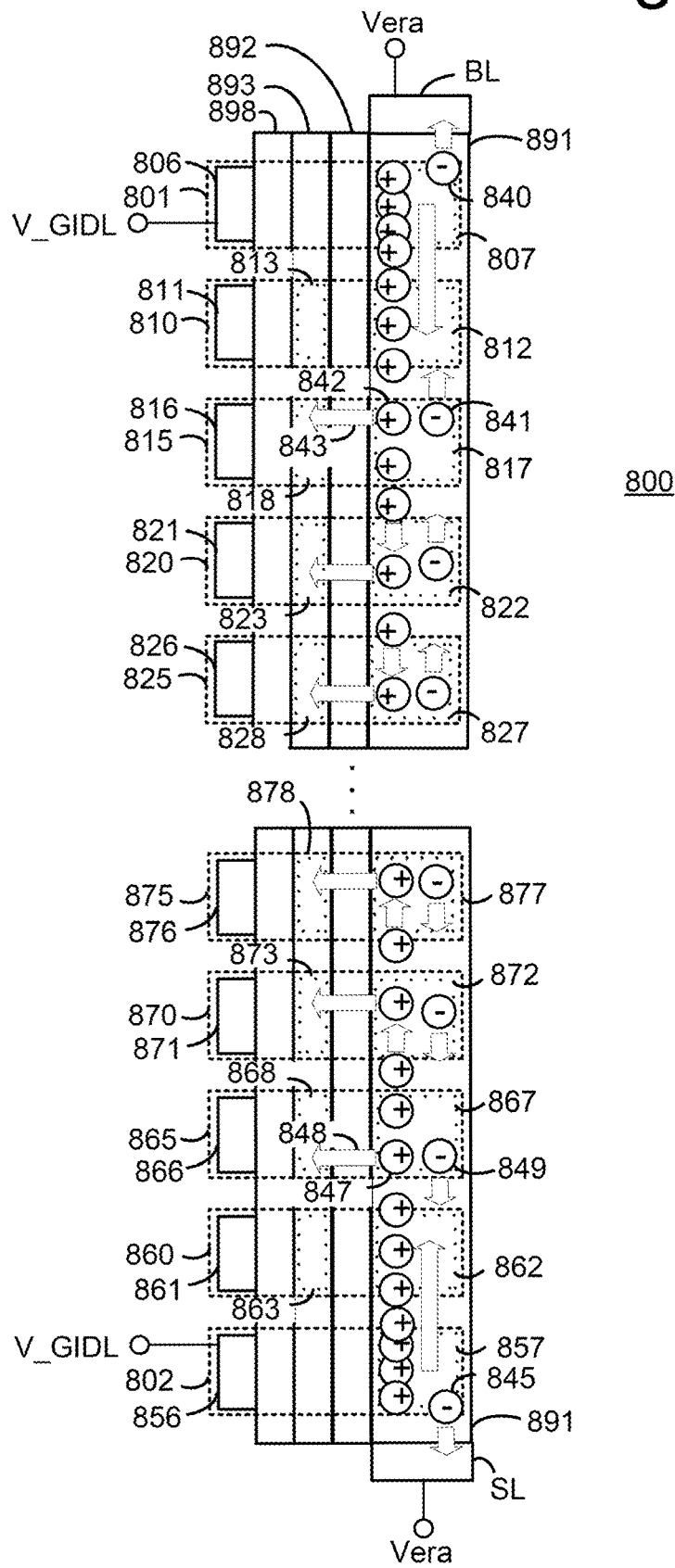
FIG. 7 depicts the erasing of a NAND string.

FIG. 7 depicts the movement of holes and electrons in a NAND string 800 during a two-sided GIDL erase. An example NAND string 800 is depicted that includes a channel 891 connected to a bit line (BL) and to a source line (SL). A tunnel dielectric layer (TNL) 892, charge trapping layer (CTL) 893, and a blocking oxide layer (BOX) 898 are layers which extend around the memory hole of the NAND string (see discussion above). Different regions of the channel layers represent channel regions which are associated with respective memory cells or select gate transistors.

Solely for purposes of simplifying the drawing and the discussion, only one drain side GIDL generation transistor 801 (e.g., representing one of SGDT0, SGDT1 or SGDT2) is depicted in FIG. 7 and only one source side GIDL generation transistor 802 (e.g., representing one of SGSB0, SGSB1 or SGSB2) is depicted in FIG. 7. Also, solely for purposes of simplifying the discussion, the select gates (i.e.

SGS and SGD) of NAND string 800 are not depicted in FIG. 7. However, FIG. 7 does show NAND string 800 including memory cells 810, 815, 820, and 825; control gates 811, 816, 821, and 826; CTL regions 813, 818, 823, and 828; and channel regions 812, 817, 822, and 827, respectively. NAND string 800 also includes memory cells 860, 865, 870, and 875; control gates 861, 866, 871, and 876; CTL regions 863, 868, 873, and 878; and channel regions 862, 867, 872, and 877, respectively.

During an erase operation, an erase voltage Vera (e.g., ~20V) is applied to both the bit line (BL) and to the source line (SL). A voltage V_GIDL (e.g., Vera-5V) is applied to the gate 806 of the GIDL generation transistor 801 and to the gate 856 of GIDL generation transistor 802 to enable GIDL. Representative holes are depicted in the channel layers as circles with a "+" sign and representative electrons are depicted in the channel layers as circles with a "−" sign. Electron-hole pairs are generated by a GIDL process. Initially, during an erase operation, the electron-hole pairs are generated at the GIDL generation transistors. The holes move away from the driven ends into the channel, thereby charging the channel to a positive potential. The electrons generated at the GIDL generation transistor 801 move toward the bit line (BL) due to the positive potential there. The electrons generated at the GIDL generation transistor 802 move toward the source line (SL) due to the positive potential there. Subsequently, during the erase period of each memory cell, additional holes are generated by GIDL at virtual junctions which are formed in the channel at the edges of the control gate of the memory cells. Some holes are removed from the channel as they tunnel to the CTL regions.

Electrons are also generated by the GIDL process. Initially, during the erase operation, the electrons are generated at the GIDL generation transistors and move toward the driven ends. Subsequently, during the erase period of each storage element, additional electrons are generated by GIDL at virtual junctions, which are formed in the channel at the edges of the control gate of the memory cells.

At one end (e.g., drain side) of the NAND string, example electrons 840 and 841 move toward the bit line. Electron 840 is generated at the GIDL generation transistor 801 and electron 841 is generated at a junction of the memory cell 815 in the channel region 817. Also, in the drain side, example holes including a hole 842 moving away from the bit line as indicated by arrows. The hole 842 is generated at a junction of memory cell 815 in the channel region 817 and can tunnel into the CTL region 818 as indicated by arrow 843.

At the other end (e.g., source side) of the NAND string, example electrons 845 and 849 move toward the source line. Electron 845 is generated at the GIDL generation transistor 802 and electron 849 is generated at a junction of the memory cell 865 in the channel region 867. Also, at the source side, example holes including a hole 847 move away from the source line and hole 847 is generated at a junction of the memory 865 in the channel region 867 and can tunnel into the CTL region 868 as indicated by arrow 848.

Figure 8:
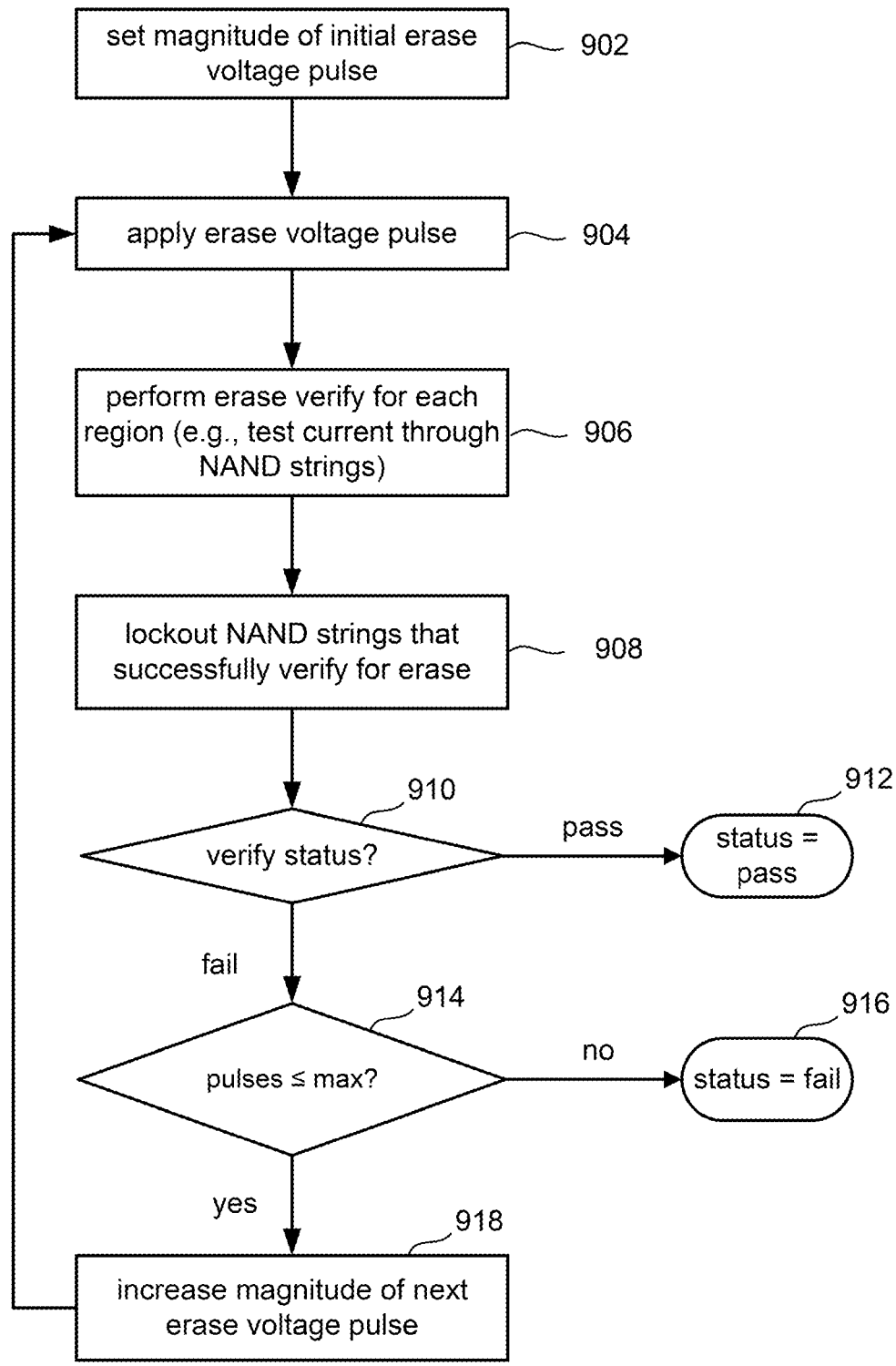
FIG. 8 is a flow chart describing one embodiment of a process for erasing.

FIG. 8 is a flow chart describing one embodiment of a traditional process for erasing non-volatile memory. In one example implementation, the process of FIG. 8 utilizes the two sided GIDL erase described by FIG. 7. In another embodiment, the process of FIG. 8 utilizes the one sided GIDL erase (GIDL at either the source side only or the drain side only). The process of FIG. 8 can be performed by any one of the one or more control circuits discussed above. For example, the process of FIG. 8 can be performed entirely by the memory die 200 (see FIG. 2A) or by the integrated memory assembly 207 (see FIG. 2B), rather than by memory controller 120. In one example, the process of FIG. 8 is performed by or at the direction of state machine 262, using other components of System Control Logic 260, Column Control Circuitry 210 And Row Control Circuitry 220. In another embodiment, the process of FIG. 8 is performed by or at the direction of memory controller 120. In one embodiment, the process of erasing is performed on a block of memory cells. That is, in one embodiment a block is the unit of erase.

In step 902 of FIG. 8, the magnitude of the initial erase voltage pulse (Vera) is set. One example of an initial magnitude is 20 volts. However, other initial magnitudes can also be used. In step 904, an erase voltage pulse is applied to the NAND strings of the block. In one embodiment of two sided GIDL erase, the erase voltage pulse is applied to the bit lines and the source line. In one embodiment of one sided GIDL erase, the erase voltage pulse is applied to the source line. In another embodiment of one sided GIDL erase, the erase voltage pulse is applied to the bit lines.

In step 906, erase verify is performed separately for each region of the block being erased. For example, in an embodiment with five regions (e.g., regions 430, 440, 450, 460 and 470 of FIG. 4B), first step 906 is performed for region 430, subsequently step 906 is performed for region 440, subsequently step 906 is performed for region 450, subsequently step 906 is performed for region 460, and finally step 906 is performed for region 470. In one embodiment, when performing erase verify for a region, erase verify for memory cells connected to even word lines is performed separately from performing erase verify for memory cells connected to odd word lines. That is, the control circuit will perform erase verify for those memory cells connected to even word lines while not performing erase verify for memory cells connected to odd word lines. Subsequently, the control circuit will perform erase verify for those memory cells connected to odd word lines while not performing erase verify for memory cells connected to even word lines. When performing erase verify for memory cells connected to even word lines, the even word lines will receive VCG_Vfy and odd word lines will receive Vread. The voltage Vread is an example of an overdrive voltage. The control circuit will sense the NAND strings (e.g., using the sense amplifiers) to determine if sufficient current is flowing in order to verify whether all of the memory cells of the NAND string have a threshold voltage lower than an erase verify voltage (e.g., Vev of FIG. 5C). When performing erase verify for memory cells connected to odd word lines, the odd word lines will receive VCG_Vfy and even word lines will receive Vread. The control circuit will sense the NAND strings to determine if sufficient current is flowing in order to verify whether all of the memory cells of the NAND string have a threshold voltage lower than an erase verify voltage. Those NAND strings that successfully verify erase are marked in step 908 so that they will be locked out from further erasing. In one embodiment that uses one sided GIDL erase from the source side, NAND strings can be locked out from further erasing by asserting an appropriate bit line voltage (e.g., 3.5 volts or Vread, which is ~8 volts). In some embodiments that use two sided GIDL erase or one sided GIDL erase from the source side, NAND strings are not locked out from further erasing and step 908 is skipped.

In step 910, the control circuit determines the status of the erase verify (from step 906). If all of the NAND strings passed erase verify for odd word lines and erase verify for even word lines, then the process will continue at step 912 and return a status of "Pass" as the erase process is not completed. In some embodiments, if the number of NAND strings that have failed erase verify is less than a first threshold then the control circuit will consider the verification process to have passed and the process will also continue at step 912. If the number of NAND strings that have failed erase verify is greater than the first threshold, then the process will continue with step 914. In one embodiment, the first threshold is a number that is smaller than the number of bits that can be corrected by ECC during a read process.

In step 914, the control circuit determines whether the number of erase voltage pulses is less than or equal to a maximum number of pulses. In one example, the maximum number is six pulses. In another example, the maximum number is 20 pulses. Other examples of maximum numbers can also be used. If the number of pulses is less than or equal to the maximum number, then the control circuit will perform another loop of the erase process (e.g., steps 904-918), which includes applying another erase voltage pulse. Thus, the process will continue at step 918 to increase the magnitude of the next erase voltage pulse (e.g., by a step size between 0.1-0.25 volts) and then the process will loop back to step 904 to apply the next erase voltage pulse. If, in step 914, it is determined that the number of erase voltage pulses already applied in the current erase process is greater than the maximum number, then the erase process failed (step 916) and the current block being erased is retired from any further use by the memory system.

Figure 9:
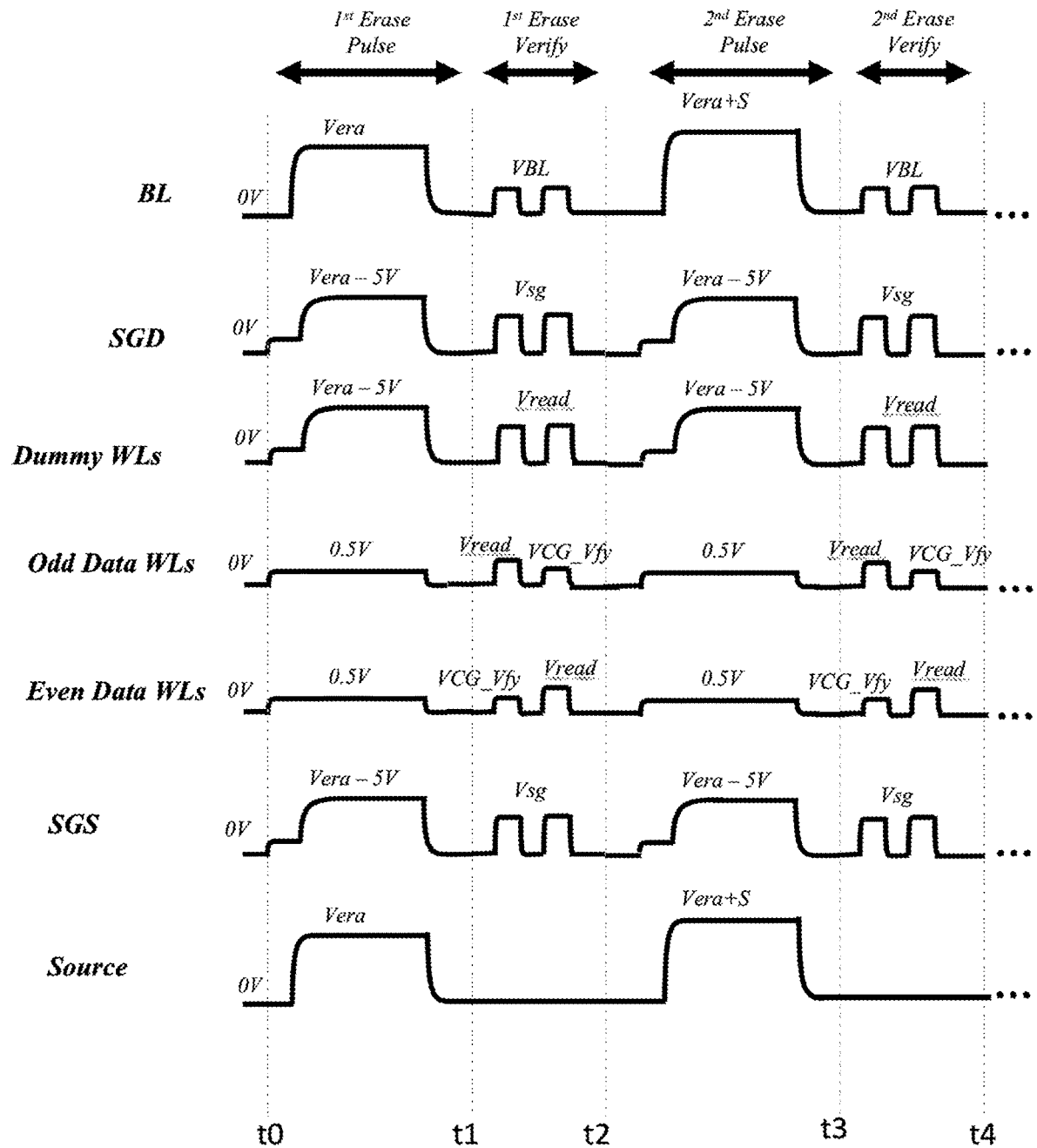
FIG. 9 is a signal timing diagram that shows the behavior of certain signals during an erase process.

FIG. 9 is a timing diagram describing the signals applied to a block of non-volatile memory (see FIGS. 4-4F) during one embodiment of a two-sided GIDL erase operation. FIG. 9 depicts behavior of the following signals: BL, SGD, Dummy WLs, Odd Data WLs, Even Data WLs, SGS and Source. The signal BL is the signal applied to all bit lines for the block being erased. The signal SGD is the signal applied to the gates of all the SGD transistors for all NAND strings of the block. The signal SGS is the signal applied to the gate of all the SGS transistors for all NAND strings of the block. The signal Source is the signal applied to the source line SL for the block. The signal Dummy WLs is the signal applied to the dummy word lines (e.g., DU, DL, DD0, DD1, DD2, DD3, DS0, DS1, DS2 and DS3) for the block, which connects to the control gates for all dummy memory cells. The signal Odd Data WLs is the signal applied to all odd data word lines (e.g., WL1, WL3, WL5, . . . ) for all NAND strings of the block. The signal Even Data WLs is the signal applied to all even data word lines (e.g., WL0, WL2, WL4, . . . ) for all NAND strings of the block. The data word lines are connected to the control gates of the data memory cells.

In general, the erase voltage is applied as a series of voltage pulses (see step 904 of FIG. 8) that increase in magnitude by a step size S (e.g., 0.1-0.3 volts) in step 918 of FIG. 8. Between and after the erase voltage pulses, erase verify is performed (step 906) which include testing to determine whether the NAND strings are successfully erased. For example, between t0 and t1 an erase voltage pulse is applied, between t2 and t3 another erase voltage is applied, between t1 and t2 (between the erase voltage pulses) erase verify is performed, and so on. In one embodiment, all memory cells of all NAND strings are tested at the same time during erase verify. In another embodiment, as depicted in FIG. 9, memory cells connected to even word lines are tested/sensed/verified separately from the testing/sensing/verifying of memory cells connected to odd word lines.

Between times t0 and t1 an erase voltage pulse is applied to BL and Source. The magnitude of the first erase voltage pulse is Vera (e.g., ~21 volts). Also between times t0 and t1, SGD and SGS are raised to a small initial voltage and then to Vera-5 volts to facilitate GIDL generation. In another embodiment, SGD and SGS are raised to an initial voltage and then to Vera-10 volts to facilitate GIDL generation. Also between times t0 and t1, Dummy WLs are set at Vera-5 volts, Odd Data WLs are set at 0.5 volts and Even Data WLs are set at 0.5 volts. The result of applying the erase voltage pulse is that the threshold voltages of the memory cells are lowered.

Between times t1 and t2, the systems perform erase verification. Source remains at ground during erase verify. A voltage VBL (e.g., ~0.6 volts) is applied to the bit lines BL. FIG. 8 shows two voltage pulses applied to BL between t1 and t2, as one voltage pulse is used to perform erase verify for memory cells connected to even word lines and the other voltage pulse is used to separately perform erase verify for memory cells connected to odd word lines. To facilitate the erase verify, two voltage pulses at Vsg (e.g., 0.3-0.6 v) are applied to SGS and SGD and two voltage pulses at Vread (e.g., 8 volts) are applied to Dummy WLs. The Even Data WLs and the Odd Data WLs also receive two voltage pulses. First, the Even Data WLs receive a voltage pulse with a magnitude of VCG_Vfy (e.g., 0.5 volts), the Odd Data WLs receive a voltage pulse with a magnitude of Vread, and the Dummy WLs receive a voltage pulse with a magnitude of Vread. This causes the memory cells connected to odd word lines to strongly conduct current and the dummy memory cells to strongly conduct current, while testing whether the memory cells connected to the even word lines have a threshold voltage below Vev of ~0.5 volts (or another value demarcating the erased state). Second, the Odd Data WLs receive a voltage pulse with a magnitude of VCG_Vfy, the Even Data WLs receive a voltage pulse with a magnitude of Vread, and the Dummy WLs receive a voltage pulse with a magnitude of Vread. This causes the memory cells connected to even word lines to strongly conduct and the dummy memory cells to strongly conduct, while testing whether the memory cells connected to the odd word lines have a threshold voltage below Vev of ~0.5 volts (or another value demarcating the erased state).

During the time period between t2-t3 an additional erase voltage pulse is applied (with step size S indicating the increase in magnitude of the voltage pulse) in the same manner as described above with respect to the time period t0-t1. During the time period between t3-t4 an additional erase verify is performed in the same manner as described above with respect to the time period t1-t2. The process depicted in FIG. 9 continue with additional erase voltage pulses and additional erase verify until all or enough memory cells (or NAND strings) pass erase verify.

Note that FIG. 9 shows two verify pulses during erase verify: one for even NAND strings and one for odd NAND strings. In some embodiment, each region (e.g., regions 430, 440, 450, 460 and 470 of FIG. 4B) is verified separately so that there will be two sets of verify pulses for each region.

FIG. 10 is a flow chart of one embodiment of a read process. In step 1002, the bit lines are biased. In step 1004, the source line SL is biased. In step 1006, the drain side select lines (SGD) are biased. In step 1008, the dummy word lines (including DU and DL) are biased. In step 1010, the unselected word lines are biased. In step 1012, the selected word line is biased. In step 1014, the source side select lines (SGS) are biased. In step 1016, the data is sensed from the selected memory cells connected to the selected word line.

In step 1018, the sensed data is decoded (e.g., as per the ECC scheme used). Sometimes the ECC decoding process of step 1018 decodes all of the data with no errors. Sometimes the ECC decoding process of step 1018 is not able to decode all of the data with no errors. In some embodiments, if the ECC decoding process of step 1018 is not able to decode all of the data with no errors, then the read process has failed. In some embodiments, the system tolerates a small number of errors and the read process is only considered to have failed if the number of errors is greater than that small number of errors. In some embodiment, the system determines the number of errors in the raw data sensed (see step 1016), and if the number of errors in the raw data sensed is greater than some predetermined threshold then the read process is halted and determined to have failed. Other criteria for determining if a read process was successful or failed can also be used. If the read process is successful (step 1020), then the decoded data is reported (e.g., to the host) in step 1022. If the read process is not successful (step 1020), then the system attempts (in step 1024) to recover the data from the memory cells using a process that take more time than a standard read process. For example, the system may look at the data being stored on one or both neighboring word lines in order to dynamically adjust bit line voltages, word line voltages, timing and other parameters based on the data being stored on one or both neighboring word lines. One example is discussed in U.S. Pat. No. 7,499,319, incorporated herein by reference in its entirety. Other data recover processes can also be used.

FIG. 11 is a timing diagram depicting the behavior of various signals during a read operation or a read operation, and provides an example implementation of a portion of the process of FIG. 10. FIG. 11 depicts the following signals: BL(sel), BL(unsel), SGD(sel), SGD(unsel), WLunsel, WLsel, DU/DL, SGS and SL. The signal BL(sel) is the voltage applied to bit lines connected to NAND strings having memory cells selected for reading. The signal BL(unsel) is the voltage applied to bit lines connected to NAND strings that do not have any memory cells selected for reading. The signal SGD(sel) is the voltage applied to the drain side select (SGD) lines (e.g., SGD0, SGD1 and SGD2 connected together for one region) for the region (e.g., regions 430, 440, 450, 460 and 470) selected for programming. The signal SGD(unsel) is the voltage applied to the drain side select (SGD) lines (e.g., SGD0, SGD1 and SGD2 connected together for one region) for the region (e.g., regions 430, 440, 450, 460 and 470) not selected for programming. The signal WLsel is the voltage applied to the word lines selected for reading (e.g., multiple word lines, such as all word lines, ten or more word lines, or other amount of word lines). The signal WLunsel is the voltage applied to the word lines not selected for reading. DU/DL is the signal applied to the dummy word lines DU and DL, which are adjacent to the Joint area. SGS is the source side select lines (e.g., SGS0, SGS1 and SGS2 connected together for one region). SL is the source line.

At time t0 of FIG. 11, all signals depicted in FIG. 11 are at Vss (ground or 0 volts). At time t1, BL(sel) is raised to Vbl (e.g., 0.5-1.5 v), DU/DL is raised to Vread and WLunsel is raised to Vread (e.g., 6-8 volts). Vread is an example of an overdrive voltage because it is high enough to turn on the memory cell regardless of which data state the memory cell has been programmed to. Vpass (used during programming) is another example of an overdrive voltage. Other overdrive voltages can also be used. Also at time t1, SGD(sel) is raised to Vsg (e.g., 3.5-6 v), an example of a sense enabling voltage, in two steps such that it reaches Vdd at t2 and Vsg at t3. At t1, a voltage spike is applied to WLn and, subsequent to the voltage on WLn settling down, WLn is raised to Vcgr (e.g., one of the read reference voltages VrA, VrB, VrC, VrD, VrE, VrF, and VrG of FIG. 5C). If the system is performing a verify operation than Vcgv (e.g., one of the verify reference voltages VvA, VvB, VvC, VvD, VvE, VvF, and VvG of FIG. 5C) is applied to WLn rather than Vcgr. When performing erase verify, Vev (see FIG. 5C) can be applied. At time t4, SGS is raised to Vsg, which provides a path for the bit line voltage to dissipate. If Vcgr (or Vcgv or Vev) is greater than the threshold voltage of the selected memory cells, then the selected memory cells will conduct current and the bit line voltage will dissipate via the source line, as depicted by curve 994. If Vcgr (or Vcgv or Vev) is not greater than the threshold voltage of the selected memory cells, then the selected memory cells will not conduct current and the bit line voltage will not dissipate via the source line, as depicted by curve 992. The sense amplifiers will sense whether the selected memory cell conducted or not at time t5 (step 1016 of FIG. 10). At time t6, BL(sel) is lowered to Vss. At time t7, SGD(sel), WLunsel, WLn, and SGS are lowered to Vss. When sensing at t5, the results of the sensing are stored in a latch at the respective sense amplifier. Afterwards, the system (e.g., control circuit) scans all of the latches of the sense amplifiers to determine which memory cells conducted and which did not conduct.

It has been observed that some memory cells connected to dummy word lines DU and DL (which are adjacent to the Joint area) experience an up-shift in threshold voltage during the lifetime of the memory. That up-shifting may be due to hot electron injection from the channel when programming memory cells connected to word lines close to DU or DL (and, therefore, close to the Joint area). Such an up-shift in threshold voltage can result in a reduction of the current through the channel during reading and/or program verify, or even cut-off the channel of NAND strings, which can lead to errors. The up-shift in threshold voltage can get worse as the memory experiences additional erase/programming cycles. For purposes of this document, an erase/programming cycle is the performance of an erase process followed by the performance of a programming process. In one embodiment, the system keeps track of the number of erase/programming cycles for each block as part of parameters P. In order to suppress the effects of the upshifting of threshold voltage of the memory cells connected to the dummy word lines DU/DL, it is proposed to adaptively adjust the voltages applied to dummy word lines during memory operations. For example, increasing the voltage applied to dummy word lines during sensing (reading, program-verify or erase verify) may compensate for an upshift of threshold voltage of the memory cells connected to the dummy word lines DU/DL.

FIGS. 12A-D, which show threshold voltage distributions on a graph plotting threshold voltage versus number of memory cells, shows memory cells connected to dummy word lines (e.g., DU and DL, which are adjacent the Joint area) experiencing an up-shift in threshold voltage during the lifetime of the memory. Dummy word lines DU/DL are used as an example for FIGS. 12A-D, but FIGS. 12A-D can apply to any dummy word lines and are not limited to DU/DL FIG. 12A depicts a fresh (e.g., unused) memory. Threshold voltage distribution 1202 represents the threshold voltages of memory cells connected to dummy word lines DU and DL, all of which a lower than Vread such that Vread can be effectively used as an overdrive voltage for DU and DL.

FIG. 12B depicts a memory that has undergone a moderate number of erase/programming cycles (e.g., 5K erase/programming cycles). Threshold voltage distribution 1202', which represents the threshold voltages of memory cells connected to dummy word lines DU and DL, has developed an upper tail 1210 as some memory cells have experienced an up-shift in threshold voltage. However, all of the memory cells still have a threshold voltage that is lower than Vread such that Vread can be effectively used as an overdrive voltage for DU and DL.

FIG. 12C depicts a memory that has undergone a larger number of erase/programming cycles (e.g., 10-15K erase/programming cycle)s. Threshold voltage distribution 1202'', which represents the threshold voltages of memory cells connected to dummy word lines DU and DL, has developed a larger upper tail 1212 as more memory cells have experienced an up-shift in threshold voltage. Some of the memory cells have a threshold voltage that is greater than Vread; therefore, Vread cannot be effectively used as an overdrive voltage for DU and DL. Instead, the overdrive voltage (e.g., that is applied to DU/DL and/or other word lines) can be adjusted, for example, by increasing the overdrive voltage Vread by an adjustment value Δ. One example of Δ is 0.2 v. Other values for Δ can also be used.

FIG. 12D depicts a memory that has undergone an even larger number of erase/programming cycles (e.g., 15-20K or more erase/programming cycles). Threshold voltage distribution 1202''', which represents the threshold voltages of memory cells connected to dummy word lines DU and DL, has developed an even larger upper tail 1214 as more memory cells have experienced an up-shift in threshold voltage. Some of the memory cells have a threshold voltage that is greater than Vread+Δ; therefore, Vread+Δ can no longer be effectively used as an overdrive voltage for DU and DL. Instead, the overdrive voltage (e.g., that is applied to DU/DL and/or other word lines) can be adjusted, for example, by increasing the overdrive voltage Vread+Δ by the adjustment value Δ such that the system will now use Vread+2Δ as an overdrive voltage applied to dummy word lines DU and DL (and/or other unselected word lines) during sensing. As more erase/programming cycles are performed and the upshift in threshold voltage of the memory cells connected to dummy word lines DU and DL increases, the memory system may need to use Vread+3Δ, Vread+4Δ, Vread+5Δ, . . . . In one embodiment, the amount of the adjustment is capped at a maximum; for example, if Vread=8 v the cap may be Vread+10Δ (10 volts). Other maximums can also be used.

FIG. 13 is a flow chart describing one embodiment of a process for performing intelligent control of the overdrive voltage applied to word lines (e.g., dummy word lines) in order to avoid memory operation failures (e.g., due to the channels of NAND strings being cut-off, or partially cut-off, by memory cells connected to dummy word lines DU/DL because the memory cells connected to dummy word lines DU and DL experienced an up-shift in threshold voltage as discussed above). The process of FIG. 13 can be performed by any one of the one or more control circuits discussed above. The process of FIG. 13 can be performed entirely by a control circuit on memory die 200 (see FIG. 2A) or entirely by a control circuit on integrated memory assembly 207 (see FIG. 2B), rather than by memory controller 120. In one example, the process of FIG. 13 is performed by or at the direction of state machine 262, using other components of System Control Logic 260, Column Control Circuitry 210 and Row Control Circuitry 220. In another embodiment, the process of FIG. 13 is performed by or at the direction of memory controller 120 using the above-mentioned circuits on memory die 200 or integrated memory assembly 207. The process of FIG. 13 is performed on a memory implementing any of the structures depicted in FIGS. 1-4F and 9.

In step 1302, the control circuit detects a memory operation failure for a plurality of memory cells. Examples of memory operations include erasing, programming, and reading. Examples of the plurality of memory cells include memory cells connected to a common word line, memory cells in a block or other groupings of memory cells. In step 1304, in response to the memory operation failure, the control circuit determines whether adjusting an overdrive voltage (e.g., Vread) applied to a word line (e.g., dummy word lines DU and/or DL) avoids the memory operation failure and the control circuit determines an amount of the adjustment (e.g., +Δ, +2Δ, +3Δ, . . . ) to the overdrive voltage applied to the word line to avoid the memory operation failure. In some embodiments, the overdrive voltage is applied to multiple word lines. If the adjusting the overdrive voltage applied to the word line(s) avoids the memory operation failure (1306), then the control circuit performs one or more additional memory operations using the adjusted overdrive voltage applied to the word line (1308). For example, the control circuit will apply Vread+Δ (rather than Vread) to DU and/or DL during future erasing, program-verify and reading operations. If the adjusting the overdrive voltage applied to the word line does not avoid the memory operation failure (1306), then in step 1310 the control circuit removes the plurality of non-volatile memory cells from use for storing host data and/or recovers the data. For example, if the plurality of memory cells are a block of memory cells (or are included in a block), then the block may be marked as a bad block so that the block will no longer be used to store data received from the host.

FIG. 14 is a flow chart describing one embodiment of a process for performing intelligent control of the overdrive voltage applied to word lines (e.g., dummy word lines) in order to avoid memory operation failures (e.g., due to the channels of NAND strings being cut-off, or partially cut-off, by memory cells connected to dummy word lines DU/DL because the memory cells connected to dummy word lines DU and DL experienced an up-shift in threshold voltage as discussed above). The process of FIG. 14 is an example implementation of the process of FIG. 13 in which the memory operation that failed is a read process.

The process of FIG. 14 can be performed by any one of the one or more control circuits discussed above. The process of FIG. 14 can be performed entirely by a control circuit on memory die 200 (see FIG. 2A) or entirely by a control circuit on integrated memory assembly 207 (see FIG. 2B), rather than by memory controller 120. In one example, the process of FIG. 14 is performed by or at the direction of state machine 262, using other components of System Control Logic 260, Column Control Circuitry 210 and Row Control Circuitry 220. In another embodiment, the process of FIG. 14 is performed by or at the direction of memory controller 120 using the above-mentioned circuits on memory die 200 or integrated memory assembly 207. The process of FIG. 14 is performed on a memory implementing any of the structures depicted in FIGS. 1-4F and 9.

In step 1402, the control circuit detects a read failure due to a failed bit count being higher than a limit. For example, when performing a read process as per FIGS. 10 and/or 11, the number of failed bits (error bits) is greater than a predetermined value. As discussed above, in response to a memory operation failure (e.g., read failure), the overdrive voltage applied to DU and/or DL is raised by an adjustment value (e.g., +Δ, +2Δ, +3Δ, . . . ). In step 1404, the control circuit adjusts the adjustment value based on temperature. For example, when the memory is operated in low temperatures, the value of Δ can be increased (e.g., by 0.01-0.1 v). Examples of low temperatures includes 0° C. and lower. In some embodiments, the memory controller, 120, memory die 200 and/or integrated memory assembly 207 can include a temperature sensor. In some embodiments, step 1404 is skipped.

In step 1406, the control circuit increases the magnitude of the overdrive voltage by the adjustment value; For example, Vread will be replaced by Vread+Δ, Vread+Δ will be replaced by Vread+2Δ, Vread+2Δ will be replaced by Vread+3Δ, etc. In step 1408, a read operation is performed (e.g., according to FIGS. 10 and/or 11). However, for example, when performing the read operation, the control circuit applies the overdrive voltage with the current adjustment (e.g., adjusted in step 1406 to be Vread+Δ or other value) to DU and/or DL.

If the read process performed in step 1408 is successful (1410), then in step 1420 the control circuit determines that adjusting the overdrive voltage applied to DU/DL avoids the read failure and control circuit identifies the adjustment used (e.g., +Δ, +2Δ, +3Δ, . . . ) to obtain the successful read process. In step 1422, the control circuit updates the overdrive voltage applied to DU/DL. For example, the control circuit stores the new voltage magnitude in parameters P in either volatile memory 140 and/or non-volatile memory array 202 (see FIGS. 1, 2A and 2B). In step 1424, the control circuit performs one or more additional/future memory operations using the adjusted overdrive voltage applied to the word line by applying the adjustment used when the read operation succeeded. That is, the updated overdrive voltage (see step 1422) is used for future read operations, future erase operations (including erase-verify) and future program-verify operations.

If the read process performed in step 1408 is not successful (1410), then in step 1430 the control circuit determines whether the maximum number of adjustment values have been added. In one embodiment, the amount of the maximum number of adjustment values is ten such that Vread+10Δ=10 volts. Other maximums can also be used. If the maximum number of adjustment values have not yet been added (1430), then the process loops back to step 1406 to add another adjustment value (e.g., the overdrive voltage is increase from Vread+Δ to Vread+2Δ, from Vread+2Δ to Vread+3Δ, from Vread+3Δ to Vread+4Δ, etc.). In this manner, steps 1406, 1408, 1410 and 1430 result in the continuing to add an adjustment value to the overdrive voltage and performing read operations until one of the read operations succeeds or a maximum number of adjustment values are added to the overdrive voltage. If the maximum number of adjustment values have been added (1430), then in step 1432 the control circuit determines that adjusting the overdrive voltage applied to the word line does not avoid the read failure. In step 1434, the control circuit recovers the data (or attempts to recover the data) using a process that take more time than a standard read process, as discussed above. If the control circuit was not able to successfully recover the data (1436), then in step 1438 the control circuit removes the memory cells from use for storing host data. For example, if the plurality of memory cells are a block of memory cells (or are included in a block), then the block may be marked as a bad block so that the block will no longer be used to store data received from the host. If the control circuit was able to successfully recover the data (1436), then in step 1440 the control circuit resumes normal operations. In one embodiment of step 1440, the overdrive voltage reverts back to its value prior to performing the process of FIG. 14 while in another embodiment of step 1440 the overdrive voltage remains at the adjusted amount.

FIG. 15 is a flow chart describing one embodiment of a process for performing intelligent control of the overdrive voltage applied to word lines (e.g., dummy word lines) in order to avoid memory operation failures (e.g., due to the channels of NAND strings being cut-off, or partially cut-off, by memory cells connected to dummy word lines DU/DL because the memory cells connected to dummy word lines DU and DL experienced an up-shift in threshold voltage as discussed above). The process of FIG. 15 is an example implementation of the process of FIG. 13 in which the memory operation that failed is an erase process.

The process of FIG. 15 can be performed by any one of the one or more control circuits discussed above. The process of FIG. 15 can be performed entirely by a control circuit on memory die 200 (see FIG. 2A) or entirely by a control circuit on integrated memory assembly 207 (see FIG. 2B), rather than by memory controller 120. In one example, the process of FIG. 15 is performed by or at the direction of state machine 262, using other components of System Control Logic 260, Column Control Circuitry 210 and Row Control Circuitry 220. In another embodiment, the process of FIG. 15 is performed by or at the direction of memory controller 120 using the above-mentioned circuits on memory die 200 or integrated memory assembly 207. The process of FIG. 15 is performed on a memory implementing any of the structures depicted in FIGS. 1-4F and 9.

In step 1502, the control circuit detects an erase failure due to too many erase pulses (see e.g., step 914 of FIG. 8). In step 1504, the control circuit adjusts the adjustment value based on temperature (e.g., similar to step 1404). In some embodiments, step 1504 is skipped. In step 1506, the control circuit increases the current magnitude of the overdrive voltage by the adjustment value; For example, Vread will be replaced by Vread+Δ, Vread+Δ will be replaced by Vread+2Δ, Vread+2Δ will be replaced by Vread+3Δ, etc. In step 1508, a program operation is performed (e.g., according to FIG. 6). However, for example, when performing program-verify, the control circuit applies the overdrive voltage with the current adjustment (e.g., adjusted in step 1506 to be Vread+Δ or other value) to DU and/or DL. In step 1510, an erase operation is performed (e.g., according to FIGS. 7-9). However, for example, when performing erase-verify, the control circuit applies the overdrive voltage with the current adjustment (e.g., adjusted in step 1506 to be Vread+Δ or other value) to DU and/or DL.

If the erase process performed in step 1510 is successful (1512), then in step 1520 the control circuit determines that adjusting the overdrive voltage applied to DU/DL avoids the erase failure and the control circuit identifies the adjustment used (e.g., +Δ, +2Δ, +3Δ, . . . ) to obtain the successful erase process. In step 1522, the control circuit updates the overdrive voltage applied to DU/DL. For example, the control circuit stores the new voltage magnitude in parameters P in either volatile memory 140 and/or non-volatile memory array 202 (see FIGS. 1, 2A and 2B). In step 1524, the control circuit performs one or more additional/future memory operations using the adjusted overdrive voltage applied to the word line by applying the adjustment used when the read operations succeeded. That is, the updated overdrive voltage (see step 1522) is used for future read operations, future erase operations (including erase-verify) and future program-verify operations.

If the erase process performed in step 1510 is not successful (1512), then in step 1530 the control circuit determines whether the maximum number of adjustment values have been added. In one embodiment, the amount of the maximum number of adjustment values is ten such that Vread+10Δ=10 volts. Other maximums can also be used. If the maximum number of adjustment values have not yet been added (1530), then the process loops back to step 1506 to add another adjustment value (e.g., the overdrive voltage is increased from Vread+Δ to Vread+2Δ, from Vread+2Δ to Vread+3Δ, from Vread+3Δ to Vread+4Δ, etc.). In this manner, steps 1506, 1508, 1510, 1512 and 1530 result in the continuing to add an adjustment value to the overdrive voltage and performing program and erase operations until one of the erase operations succeeds or a maximum number of adjustment values are added to the overdrive voltage. If the maximum number of adjustment values have been added (1530), then in step 1532 the control circuit determines that adjusting the overdrive voltage applied to the dummy word lines does not avoid the erase failure. In step 1534, the control circuit removes the memory cells from use for storing host data. For example, if the plurality of memory cells are a block of memory cells (or are included in a block), then the block may be marked as a bad block so that the block will no longer be used to store data received from the host.

A memory system has been proposed that includes intelligent control of the overdrive voltage applied to word lines (e.g., dummy word line) in order to avoid the memory operation failures.

One embodiment includes a non-volatile storage apparatus, comprising: a plurality of non-volatile memory cells; a plurality of word lines connected to the non-volatile memory cells; and a control circuit connected to the non-volatile memory cells and the word lines. The control circuit is configured to: detect a memory operation failure; in response to the memory operation failure, determine whether adjusting an overdrive voltage applied to a first word line avoids the memory operation failure; and perform one or more additional memory operations using the adjusted overdrive voltage applied to the first word line if the adjusting the overdrive voltage applied to the word line avoids the memory operation failure.

In one example implementation, the word lines include data word lines and dummy word lines; and the first word line is a dummy word line.

In one example implementation, the memory operation failure is due to channels of the NAND strings being cut-off by memory cells connected to the dummy word line In one example implementation, the plurality of non-volatile memory cells and the word lines are positioned in a memory structure; the word lines include data word lines and dummy word lines; the memory structure comprises a first stack of word line layers alternating with dielectric layers and a second stack of word line layers alternating with dielectric layers; the memory structure further comprises a Joint area between the first stack and the second stack; the word lines layers form the word lines; and the first word lines is a dummy word line that is adjacent to the Joint area.

One embodiment includes a method, comprising: detecting a memory operation failure; in response to detecting the memory operation failure, determining an amount of an adjustment to an overdrive voltage applied to a dummy word line to avoid the memory operation failure; and in response to determining amount of the adjustment to the overdrive voltage, performing one or more additional memory operations using the adjusted overdrive voltage applied to the dummy word line.

One embodiment includes a non-volatile storage apparatus, comprising: a memory structure comprising non-volatile memory cells arranged as NAND strings and word lines connected to the memory cells, the word lines include data word lines and a dummy word line, the memory structure comprises a first stack of word line layers alternating with dielectric layers and a second stack of word line layers alternating with dielectric layers, the memory structure further comprises a Joint area between the first stack and the second stack, the word lines layers form the word lines, the dummy word line is adjacent to the Joint area; and means for deciding, in response to a memory operation failure, whether applying a higher overdrive voltage to the dummy word line during future memory operations will avoid the memory operation failure and for determining how much to increase the overdrive voltage to avoid the memory operation failure.

Examples of the means for deciding whether applying a higher overdrive voltage to the dummy word line during future memory operations will avoid the memory operation failure and for determining how much to increase the overdrive voltage to avoid the memory operation failure includes any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits (including hardware only or a combination of hardware and software/firmware) performing the process of FIG. 13, 14 or 15.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a plurality of non-volatile memory cells;
a plurality of word lines connected to the non-volatile memory cells; and
a control circuit connected to the non-volatile memory cells and the word lines, the control circuit is configured to:
perform a memory operation including applying an overdrive voltage to a first word line of the plurality of word lines, the first word line is not selected for the memory operation;
detect that the memory operation failed;
in response to detecting that the memory operation failed, determine whether adjusting the overdrive voltage applied to the first word line avoids the memory operation failure; and
perform one or more additional memory operations using the adjusted overdrive voltage applied to the first word line if the adjusting the overdrive voltage applied to the word line avoids the memory operation failure.

2. The non-volatile storage apparatus of claim 1, wherein:
the word lines include data word lines and dummy word lines; and
the first word line is a dummy word line.

3. The non-volatile storage apparatus of claim 1, wherein:
the word lines include data word lines and dummy word lines;
the plurality of non-volatile memory cells and the word lines are positioned in a memory structure;
the memory structure comprises a first stack of word line layers alternating with dielectric layers and a second stack of word line layers alternating with dielectric layers;
the memory structure further comprises a Joint area between the first stack and the second stack;
the word lines layers form the word lines; and
the first word line is a dummy word line that is adjacent to the Joint area.

4. The non-volatile storage apparatus of claim 1, wherein the control circuit is further configured to:
determine an amount of an adjustment to the overdrive voltage applied to the first word line to avoid the memory operation failure.

5. The non-volatile storage apparatus of claim 1, wherein the control circuit is configured to:
remove the plurality of non-volatile memory cells from use for storing host data if the adjusting the overdrive voltage applied to the first word line does not avoids the memory operation failure.

6. The non-volatile storage apparatus of claim 1, wherein:
the plurality of non-volatile memory cells comprise a block; and
the control circuit is configured to mark the block as a bad block if the adjusting the overdrive voltage applied to the first word line does not avoid the memory operation failure.

7. The non-volatile storage apparatus of claim 1, wherein:
the memory operation failure is a read failure; and
the control circuit is configured to recover data from the plurality of non-volatile memory cells using a process that takes more time than a standard read process if the adjusting the overdrive voltage applied to the first word line does not avoid the memory operation failure.

8. The non-volatile storage apparatus of claim 1, wherein:
the word lines include data word lines and dummy word lines;
the first word line is a dummy word line;
the memory operation failure is a read failure due to a failed bit count being higher than a limit;
the control circuit is configured to determine whether adjusting the overdrive voltage applied to the first word line avoids the memory operation failure by:
continuing to add an adjustment value to the overdrive voltage and performing read operations until one of the read operations succeeds or a maximum number of adjustment values are added to the overdrive voltage;
if one of the read operations succeeds: determining that adjusting the overdrive voltage applied to the first word line avoids the read failure and identifying the adjustment used when the read operation succeeds;
if the maximum number of adjustment values are added to the overdrive voltage:
determining that adjusting the overdrive voltage applied to the first word line does not avoid the read failure; and
the control circuit is configured to perform one or more additional memory operations using the adjusted overdrive voltage applied to the word line by applying the adjustment used when one of the read operations succeeds.

9. The non-volatile storage apparatus of claim 8, wherein:
the control circuit is configured to adjust the adjustment value based on temperature.

10. The non-volatile storage apparatus of claim 1, wherein:
the word lines include data word lines and dummy word lines;
the first word line is a dummy word line;
the memory operation failure is an erase failure;
the control circuit is configured to determine whether adjusting the overdrive voltage applied to the first word line avoids the memory operation failure by:
continuing to add an adjustment value to the overdrive voltage and performing program and erase operations until one of the erase operations succeeds or a maximum number of adjustment values are added to the overdrive voltage;
if one of the erase operations succeeds: determining that adjusting the overdrive voltage applied to the first word line avoids the erase failure and identifying the adjustment used when the erase operation succeeds;
if the maximum number of adjustment values are added to the overdrive voltage:
determining that adjusting the overdrive voltage applied to the first word line does not avoid the erase failure; and
the control circuit is configured to perform one or more additional memory operations using the adjusted overdrive voltage applied to the word line by applying the adjustment used when one of the erase operations succeeds.

11. A method, comprising:
performing a memory operation including applying an overdrive voltage to a dummy word line, the dummy word line is not selected for the memory operation;
detecting that the memory operation failed;
in response to detecting that the memory operation failed, determining an amount of an adjustment to an overdrive voltage applied to the dummy word line to avoid the memory operation failure; and in response to determining amount of the adjustment to the overdrive voltage, performing one or more additional memory operations using the adjusted overdrive voltage applied to the dummy word line.

12. The method of claim 11, wherein:

the memory operation failed for a memory structure comprising non-volatile memory cells arranged as NAND strings and word lines connected to the memory cells, the word lines include data word lines and the dummy word line, the memory structure comprises a first stack of word line layers alternating with dielectric layers and a second stack of word line layers alternating with dielectric layers, the memory structure further comprises a Joint area between the first stack and the second stack, the word lines layers form the word lines, the dummy word line is adjacent to the Joint area; and the memory operation failure is due to channels of the NAND strings being cut-off by memory cells connected to the dummy word line.

13. The method of claim 11, further comprising:

in response to detecting that the memory operation failed, determining whether adjusting the overdrive voltage applied to the dummy word line avoids the memory operation failure.

14. The method of claim 13, wherein:

the memory operation is a read operation;

the memory operation failure is a read failure; and the determining whether adjusting the overdrive voltage applied to the dummy word line avoids the memory operation failure and the determining the amount of the adjustment comprise:

continuing to add an adjustment value to the overdrive voltage and performing read operations until one of the read operations succeeds or a maximum number of adjustment values are added to the overdrive voltage;

in response to one of the read operations succeeding: determining that adjusting the overdrive voltage applied to the first word line avoids the memory operation failure and identifying the adjustment used when the read operation succeeds;

in response to the maximum number of adjustment values being added to the overdrive voltage: determining that adjusting the overdrive voltage applied to the first word line does not avoid the memory operation failure; and the performing one or more additional memory operations applies the adjustment used when one of the read operations succeeds.

15. The method of claim 13, wherein:

the memory operation is a read operation;

the memory operation failure is a read failure; and the determining whether adjusting the overdrive voltage applied to the dummy word line avoids the memory operation failure and the determining the amount of the adjustment comprise:

continuing to add an adjustment value to the overdrive voltage and performing program and erase operations until one of the erase operations succeeds or a maximum number of adjustment values are added to the overdrive voltage;

in response to one of the erase operations succeeding: determining that adjusting the overdrive voltage applied to the first word line avoids the memory operation failure and identifying the adjustment used when the erase operation succeeds;

if the maximum number of adjustment values are added to the overdrive voltage:

determining that adjusting the overdrive voltage applied to the first word line does not avoid the memory operation failure; and the performing one or more additional memory operations applies the adjustment used when one of the erase operations succeeds.

16. A non-volatile storage apparatus, comprising:

a memory structure comprising non-volatile memory cells arranged as NAND strings and word lines connected to the memory cells, the word lines include data word lines and a dummy word line, the memory structure comprises a first stack of word line layers alternating with dielectric layers and a second stack of word line layers alternating with dielectric layers, the memory structure further comprises a Joint area between the first stack and the second stack, the word lines layers form the word lines, the dummy word line is adjacent to the Joint area; and means for performing a read operation including applying an overdrive voltage to the dummy word line during the read operation and deciding, in response to the read operation failing whether applying a higher overdrive voltage to the dummy word line during future read operations will avoid the read operation failures and for determining how much to increase the overdrive voltage to avoid the read operation failures.

17. The non-volatile storage apparatus of claim 1, wherein:

the control circuit is configured to determine whether adjusting the overdrive voltage applied to the first word line avoids the memory operation failure by continuing to add an adjustment value to the overdrive voltage and performing memory operations until one of the memory operations succeeds.

* * * * *